(12) United States Patent
Lieten et al.

(10) Patent No.: US 8,017,509 B2
(45) Date of Patent: Sep. 13, 2011

(54) GROWTH OF MONOCRYSTALLINE GEN ON A SUBSTRATE

(75) Inventors: Ruben Lieten, Zonhoven (BE); Stefan Degroote, Scherpenheuven-Zichem (BE); Gustaaf Borghs, Leuven (BE)

(73) Assignees: IMEC, Leuven (BE); Vrije Universiteit Brussel, Brussels (BE)

( * ) Notice: Subject to any disclaimer, the term of this patent is extended or adjusted under 35 U.S.C. 154(b) by 255 days.

(21) Appl. No.: 12/309,940

(22) PCT Filed: Jul. 20, 2007

(86) PCT No.: PCT/BE2007/000087
§ 371 (c)(1),
(2), (4) Date: Apr. 15, 2009

(87) PCT Pub. No.: WO2008/011688
PCT Pub. Date: Jan. 31, 2008

(65) Prior Publication Data
US 2011/0089520 A1 Apr. 21, 2011

Related U.S. Application Data

(60) Provisional application No. 60/834,257, filed on Jul. 27, 2006.

(30) Foreign Application Priority Data

Mar. 21, 2007 (EP) .................... 07005755

(51) Int. Cl.
*H01L 21/20* (2006.01)
*H01L 21/36* (2006.01)

(52) U.S. Cl. ........ 438/509; 438/572; 438/507; 257/472; 257/616; 257/E29.089; 257/E21.127; 257/E21.133

(58) Field of Classification Search .......... 438/572, 438/933, 509, 507; 257/472, 616, E29.082, 257/E21.328, E29.089, E21.127, E21.133
See application file for complete search history.

(56) References Cited

U.S. PATENT DOCUMENTS

| 4,254,429 A | * | 3/1981 | Yamazaki | 257/65 |
| 4,514,748 A | * | 4/1985 | Bean et al. | 257/184 |
| 4,671,845 A |   | 6/1987 | Yoder | |
| 5,357,122 A | * | 10/1994 | Okubora et al. | 257/84 |
| 2001/0038655 A1 | * | 11/2001 | Tanaka et al. | 372/43 |
| 2006/0145186 A1 | * | 7/2006 | Wallis | 257/190 |
| 2008/0001181 A1 | * | 1/2008 | Rakshit et al. | 257/233 |

OTHER PUBLICATIONS

Wang et al., "Thermal stability and band alignments for $Ge_3N_4$ dielectrics on Ge," Applied Physics Letters 89, 022105 (2006).

(Continued)

*Primary Examiner* — Tu-Tu Ho
(74) *Attorney, Agent, or Firm* — Knobbe Martens Olson & Bear LLP

(57) ABSTRACT

The present invention relates a method for forming a monocrystalline GeN layer (4) on a substrate (1) comprising at least a Ge surface (3). The method comprises, while heating the substrate (1) to a temperature between 550° C. and 940° C., exposing the substrate (1) to a nitrogen gas flow. The present invention furthermore provides a structure comprising a monocrystalline GeN layer (4) on a substrate (1). The monocrystalline GeN formed by the method according to embodiments of the invention allows passivation of surface states present at the Ge surface (3).

30 Claims, 10 Drawing Sheets

OTHER PUBLICATIONS

Johnson et al., "Plasma-deposited germanium nitride gate insulators for indium phosphide metal-insulator-semiconductor field-effect transistors," Journal of Applied Physics, 69(6), (1991), 3616.

Young et al., "Preparation of Germanium Nitride Films by Low Pressure Chemical Vapor Deposition," Journal of the Electrochemical Society, 134(11), (1987), 2867.

Synorov et al., "Production of Nitrides on the Surface of Monocrystalline Germanium," Soviet Physics Journal, 10(3), (1967), 7-11.

Hua et al., "Thin germanium nitride films grown by thermal reaction process," J. Appl. Phys. 53(12), (1982), 8969.

Chambouleyron et al., "Nitrogen in germanium," Journal of Applied Physics, 84(1), (1998), 1.

* cited by examiner (a)                                (b)

GROWTH OF MONOCRYSTALLINE GEN ON A SUBSTRATE

CROSS-REFERENCE TO RELATED APPLICATIONS

This application is the national phase under 35 U.S.C. §371 of PCT International Application No. PCT/EP2007/000087 which has an International filing date of Jul. 20, 2007, which designates the United States of America and which claims priority to U.S. Provisional Application Ser. No. 60/834,257 filed Jul. 27, 2006, the disclosures of each of which are hereby incorporated by reference in their entireties.

TECHNICAL FIELD OF THE INVENTION

The present invention relates to a method for forming a monocrystalline GeN layer on a substrate comprising at least a Ge surface and a structure comprising a monocrystalline GeN layer on a substrate.

BACKGROUND OF THE INVENTION

Group III-Nitrides have gained a lot of importance for the last decade, for example in semiconductor processing. Examples of applications are High Electron Mobility Transistors (HEMT) for high power and high frequency applications, blue LEDs, etc.

An example of group III-nitrides are Ge-nitrides. Ge-Nitrides have been first synthesized by Johnson in 1930 (J. Am. Chem. Soc. 52, 5160 (1930)) by exposing a powder sample of Ge to an ammonia atmosphere at high temperatures (~700° C.). This material was later on identified to have the phenacite hexagonal structure $\beta$-$Ge_3N_4$ (Z. Anorg. Allg. Chem. 241, 32 (1939)).

In the mean, time, a lot of experimental work has been devoted to the formation of stable GeN layers, e.g. $Ge_3N_4$ layers, by different methods. The layers obtained so far on crystalline Ge are either amorphous or polycrystalline. Two different hexagonal structures as well as one rhombic structure have been identified. In Table 1, lattice parameters are listed for different crystalline GeN structures as mentioned in literature (Molina, Int. J. Quantum Chem. 80, 249 (2000)).

TABLE 1

Lattice parameters for different crystalline GeN structures.

| Structure | A [Å] | C [Å] | B [Å] | Density [g/cm3] |
|---|---|---|---|---|
| $\beta$-$Ge_3N_4$ | 8.032 | 8.078 | | 5.287 |
| $\alpha$-$Ge_3N_4$ | 8.202 | 5.941 | | 5.254 |
| c-$Ge_3N_4$ | 13.84 | 8.18 | 9.06 | 5.287 |

A way of forming GeN is by nitridation of a germanium substrate. It is known that nitridation of Ge using a $N_2$ plasma cell in a UHV (ultrahigh vacuum) chamber at temperatures of between 100° C. and 550° C. results in the formation of amorphous $Ge_3N_4$ (Wang et al. Applied Physics Letters 89, 022105 (2006)). It was found that after annealing at 600° C. in vacuum, this layer completely evaporated, implying that the $Ge_3N_4$ film is not stable at temperatures above 600° C. Nitridation of Ge layers in UHV by a $N_2$ plasma cell is known to lead to amorphous GeN (T. Maeda, T. Yasuda, M. Nishizawa, N. Miyata, Y. Morita, S. Takagi, Applied Physics Letters Volume 85, 15, 2004).

Exposure of Ge to an ammonia ($NH_3$) atmosphere at high temperatures has been used to form GeN. Johnson et at (J. Am. Chem. Soc. 52, 5160 (1930)) have shown that by exposing a powder sample of Ge to an ammonia atmosphere at high temperatures (~700° C.) GeN can be synthesized. However the GeN obtained is in powder form and does not form an epitaxial layer on top of a crystalline Ge layer. It was furthermore reported in 1967 (V. F. Synorov, E. A. Kuznetsova, and N. M. Aleinikov, Soviet Physics Journal, Vol. 10, No. 3, pp. 7-11, 1967) that annealing of Ge under ammonia atmosphere leads to the formation of many phases: hexagonal GeN, a loose layer of rhombohedral GeN and $GeO_2$. It is therefore known that exposure of Ge at high temperature to an ammonia atmosphere leads to the formation of polycrystalline GeN.

SUMMARY OF THE INVENTION

It is an object of embodiments of the present invention to provide a good method for forming a monocrystalline GeN layer on a substrate comprising at least a Ge surface and to provide a structure comprising a monocrystalline GeN layer on a substrate.

The structure obtained by the method according to embodiments of the invention can be used for further growing crystalline materials thereupon.

The GeN grown on the substrate using the method according to embodiments of the invention, can be used to form Ohmic or rectifying (Schottky) contacts with improved characteristics.

The GeN grown on the substrate using the method according to embodiments of the invention may serve as a passivation layer for passivating surface states present at the Ge surface.

The above objective is accomplished by a method and device according to the present invention.

In a first aspect, the present invention provides a method for forming a monocrystalline GeN layer on a substrate, the substrate comprising at least a Ge surface. The method comprises, while heating the substrate to a temperature between 550° C. and 940° C., exposing the substrate to a nitrogen gas flow.

The formation of a monocrystalline GeN layer on the substrate with at least a Ge surface makes the substrate suitable to be used in further processing of e.g. semiconductor devices. For example, the GeN layer can be used to form layers of other materials on, e.g. layers of group III-nitrides such as GaN, or conductive contacts can be advantageously formed on the GeN layer. This is because the GeN layer passivates surface states present in the GeN layer.

Exposing the substrate to a nitrogen gas flow may be performed by exposing the substrate to a nitrogen gas flow comprising $N_2$ or $NH_3$.

The substrate may comprise at least a Ge surface with a hexagonal structure.

The Ge surface may have a (111) orientation with an offcut between 0° and 15°.

According to embodiments of the invention, the method may furthermore comprise applying a plasma while exposing the substrate to a nitrogen gas flow.

Upon heating the substrate the Ge surface may be reorganized.

The method may furthermore comprise patterning the GeN layer.

According to embodiments of the invention, the method may furthermore comprise maintaining the nitrogen gas flow during cooling down of the substrate to a temperature below 650° C. after formation of the monocrystalline GeN layer.

Maintaining a nitrogen flow ($N_2$ plasma or $NH_3$ flow) towards the Ge layer during cooling down may balance the evaporation of GeN and lead to the formation of a stable monocrystalline GeN layer. That way a thin monocrystalline GeN layer can be formed and maintained.

In a second aspect, the present invention provides a method for forming metal contacts on a substrate. The method comprises:

forming a monocrystalline GeN layer on a substrate comprising at least a Ge surface by using the method according to embodiments of the present invention, and forming metal contacts on the monocrystalline GeN layer.

According to embodiments of the invention, forming metal contacts on the monocrystalline GeN layer may be performed such that the metal contacts are Ohmic contacts.

According to other embodiments of the invention, forming metal contacts on the monocrystalline GeN layer may be performed such that the metal contacts are Schottky contacts.

The present invention furthermore provides, in a further aspect, a method for forming at least one group III-nitride layer on a substrate. The method comprises:

forming a monocrystalline GeN layer on a substrate comprising at least a Ge surface by using the method according embodiments of the present invention, and forming at least one group III-nitride layer on the GeN layer.

Forming at least one group III-nitride layer on the GeN layer may be performed by depositing at least one group III-nitride layer at a deposition temperature between 550° C. and 850° C.

The method may furthermore comprise patterning at least one of the at least one group III-nitride layer.

The present invention also provides the use of a method according to embodiments of the invention in semiconductor processing.

The present invention also provides the use of a method according to embodiments of the invention in a manufacturing process for making a junction diode.

In still a further aspect, the present invention provides a structure comprising:

a substrate comprising at least a Ge surface, a monocrystalline GeN layer on top of and in direct contact with the Ge surface of the substrate.

The Ge surface may have a hexagonal symmetry.

The Ge surface may have (111) orientation.

The Ge surface may have (111) orientation with an off-cut between 0° and 15°.

The monocrystalline GeN layer may have a thickness of between 0.1 nm and 100 nm, more particularly between 0.3 nm and 10 nm or between 0.1 nm and 5 nm and more particularly between 0.1 nm and 2 nm.

The monocrystalline GeN layer may be patterned.

According to embodiments of the invention, the structure may furthermore comprise metal contacts in direct contact with the monocrystalline GeN layer.

According to embodiments of the invention, the contacts may be Ohmic contacts.

According to other embodiments of the invention, the contacts may Schottky contacts.

The method may furthermore comprise depositing at least one insulating layer on top of the GeN layer.

The at least one insulating layer may be selected from the group consisting of SiN, SiO, HfO and organic materials.

According to embodiments of the invention, the structure may furthermore comprise at least one group III-nitride layer on the monocrystalline GeN layer.

At least one of the at least one group III-nitride layer may be patterned.

The present invention furthermore provides a semiconductor device comprising at least one structure according to embodiments of the present invention.

The semiconductor device may be a junction diode.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1A:
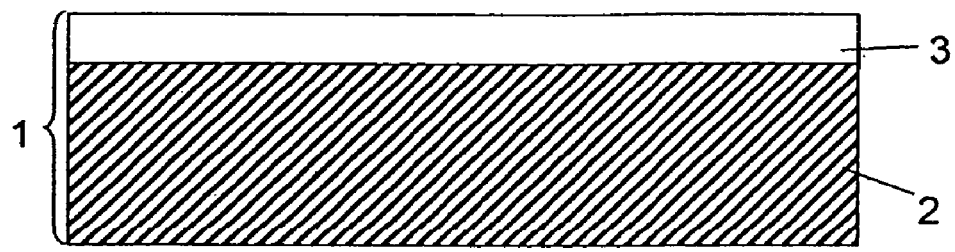
FIG. 1A to FIG. 1C illustrate subsequent steps in a method according to embodiments of the invention.

In the different figures, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms top, bottom, over, under and the like in the description and the claims are used for descriptive purposes and not necessarily for describing relative positions. The terms so used are interchangeable under appropriate circumstances and the embodiments described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the preferred embodiments, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

As described above, nitridation of a Ge layer in ultrahigh vacuum (UHV) using a plasma cell is known to lead to an amorphous GeN layer that is not stable above 600° C. Annealing under $NH_3$ atmosphere is known to lead to different phases of GeN.

It would be useful to be able to form a mono- or single crystalline GeN layer, without grain boundaries. The ability to form single crystalline GeN may be useful for the following, non-limiting, reasons:

Single crystalline GeN, which is grown pseudomorphically on the substrate, shows homogenous or uniform properties over larger areas on a substrate, e.g. a wafer. This is not the case for polycrystalline materials where grain boundaries can cause local differences in these properties, for example optical properties. In a region with grain boundaries, many surface states will be present. When in this area for example a gate is made, this gate will suffer from these surface states and operate at a lower speed than for regions with less or, no grain boundaries.

Single crystalline GeN can protect the underlying Ge from, for example, oxidation. At grain boundaries in polycrystalline films, the underlying Ge layer can be oxidized. Oxygen can easily diffuse via these grain boundaries towards the GeN/Ge interface to oxidize the Ge.

Single crystalline GeN can be used for reducing the number of surface dangling bonds of underlying Ge. So it can be useful for, for example, gate passivation in CMOS, or for making good metal contacts on (Ohmic or Schottky).

Single crystalline GeN will facilitate growth of high-quality crystalline materials on top of it.

Single crystalline GeN can act as a protection (separation) layer of underlying Ge during deposition of other materials (amorphous, poly-crystalline, crystalline) on top of it.

In the above description, with "pseudomorphic" is meant that the in-plane lattice parameters of the GeN layer formed on a substrate substantially perfectly match lattice parameters of the underlying substrate.

In virtue of the above, the present invention provides a method for forming a monocrystalline GeN layer on a substrate, the substrate comprising at least a Ge surface, and a structure comprising a monocrystalline GeN layer on a substrate.

With forming a GeN layer is meant depositing or growing a GeN layer on the substrate. In the further description, the terms forming, depositing and growing may be used next to each other, all indicating the same end result, i.e. the formation of a GeN layer on the substrate.

The method for forming a monocrystalline GeN layer on a substrate, the substrate comprising at least a Ge surface, comprises exposing the substrate to a nitrogen gas flow, while heating the substrate to a temperature between 550° C. and 940° C., preferably between 550° C. and 850° C. or between 600° C. and 880° C., more preferably between 700° C. and 800° C. and for example to a temperature of 700° C. This may be performed in a deposition chamber of a processing tool.

Whenever in the description reference is made to single crystalline GeN or monocrystalline GeN it has to be noted that the same thing is meant, i.e. a GeN layer without grain boundaries.

According to embodiments of the invention, the substrate may be formed of any suitable material or combination of materials, also referred to as support; with on top a Ge layer having at least a Ge top surface, for example GaAs with on top a Ge layer or Si with on top a Ge layer. In embodiments of the present invention, the term "support" may include any underlying material or materials that may be used, or upon which a device, a circuit or an epitaxial layer may be formed. In other alternative embodiments, this "support" may include a semiconductor substrate such as e.g. doped or undoped silicon, a gallium arsenide (GaAs), a gallium arsenide phosphide (GaAsP), an indium phosphide (InP) or a silicon germanium (SiGe) on silicon substrate. Also group III-nitrides grown on Sapphire or Si, such as e.g. GaN on Sapphire or GaN on Si, with one or more interlayers, such as e.g. AlN, may be used as support. The "support" may also include for example an insulating layer such as a $SiO_2$ or an $Si_3N_4$ layer in addition to a semiconductor substrate portion. The term "support" also includes silicon-on-glass, silicon-on sapphire substrates. The term "support" is thus used to define generally the elements for layers that underlie a layer or portions of interest. Also, the "support" may be any other base on which a layer is formed, for example a glass, plastic or metal layer. A Ge layer may be provided on the support.

According to embodiments of the invention, crystalline Ge substrates with (111) orientation can be used. Also off-cut Ge(111) substrates can be used, i.e. off-oriented Ge(111) or tilted Ge(111) substrates. The off-cut angle may preferably be between 0° and 15°, or between 2° and 10°, between 4° and 8°, or between 4° and 6°, such as for example 2°, 4°, 4.7°, 6°, 8°.

According to embodiments of the invention, the top Ge layer may also be crystalline Ge(111) formed by the transformation of amorphous Ge during annealing under an $N_2$ atmosphere or $N_2$ plasma at temperatures above.

500° C. When heating an amorphous Ge top layer on e.g. Si(111) as a support under an $N_2$ atmosphere or in an $N_2$ plasma at temperatures above 500° C., Ge(111) is formed. There may be an off-cut, i.e. off-oriented Ge(111) or tilted Ge(111). The off-cut angle may preferably be between 0° and 15°, or between 2° and 10°, between 4° and 8°, or between 4° and 6°, such as for example 2°, 4°, 4.7°, 6°, 8°.

According to embodiments of the invention, the top Ge layer or Ge surface may be crystalline. The orientation of the top Ge layer may be (111). There may also be an off-cut of the top Ge(111) layer, i.e. off-oriented Ge(111) or tilted Ge(111). The off-cut angle may be between 0° and 15°, or between 2° and 10°, between 4° and 8°, or between 4° and 6°, such as for example 2°, 4°, 4.7°, 6°, 8°.

According to further embodiments of the invention, the orientation of the top Ge layer or Ge surface may be (001).

The Ge forming at least a top surface of the substrate may also be doped with suitable dopants, for example Ga.

According to embodiments of the invention where the substrate comprises a support with a Ge(111) top layer, the thickness of the Ge(111) top layer may be between 0.4 nm and 500 micron, for example between 5 nm and 500 micron, between 0.4 nm and 100 micron, between 10 nm and 100 micron, between 100 nm and 10 micron, between 500 nm and 1000 nm.

The method according to embodiments of the invention allows forming a stable GeN layer as a thin single crystalline layer on top of a substrate comprising at least a Ge surface by exposing this Ge surface to a nitrogen flow at elevated temperatures. It has to be noted that Ge has a melt temperature of 940° C. Therefore, nitridation temperatures for the growth of GeN onto a substrate comprising at least a Ge top layer or Ge surface are limited.

Different types of deposition are known and can be used with the method according to embodiments of the present invention. Examples are MBE (molecular beam epitaxy), e.g. plasma-assisted or ammonia MBE, and CVD (chemical vapor deposition).

According to embodiments of the invention, two different implementations can be used for exposing the Ge surface to a nitrogen flow at elevated temperatures.

According to a first implementation, in a vacuum deposition chamber (pressure below $10^{-3}$ mbar), a monocrystalline GeN layer is formed, e.g. at temperatures higher than 550° C., higher than 600° C. or even higher than 650° C., by introducing an $N_2$ gas in the deposition chamber. The $N_2$ molecules can be cracked by heating the Ge substrate or by using a $N_2$ plasma. Other nitrogen sources, such as an $NH_3$ flow, could be used as well in combination with a high Ge temperature or a plasma. The GeN layer formed by this method is found to be monocrystalline for, for example, Ge(111) substrates or Ge(111) substrates with off-cuts.

Maintaining a nitrogen flow ($N_2$ plasma or $NH_3$ flow) towards the Ge layer during cooling down may balance the evaporation of GeN and lead to the formation of a stable monocrystalline GeN layer. That way a thin monocrystalline GeN layer can be formed and maintained.

According to a second implementation, in a deposition chamber operating at higher pressures (e.g. between atmospheric pressure and $10^{-3}$ mbar), exposure of a substrate comprising at least a Ge surface, e.g. Ge(111) surface, at high temperatures, e.g. between 550 and 940° C., between 600 and 940° C., between 650 and 940° C., or between 650 and 880° C., in particular around 800° C. to an ammonia atmosphere forms a smooth single crystalline GeN layer on top of the Ge surface, e.g. Ge(111) surface. With smooth is meant that the roughness of the GeN layer formed may preferably be not higher than 2 nm, in particular not higher than 1 nm and may for example be about 0.4 nm. Exposure of a substrate comprising at least a Ge surface, e.g. Ge(111) surface, at high temperatures between 550 and 940° C., between 600° C. and 940° C., between 650 and 940° C., or between 650 and 880° C. to an $N_2$ atmosphere (pressure of 1 bar) forms a smooth single crystalline GeN layer on top of the Ge surface, e.g. Ge(111) surface.

In both above-described implementations, the monocrystalline GeN layer may be stabilized on the Ge surface, e.g. Ge(111) surface, of the substrate and may be limited in thickness by the unstable character of the Ge—N bonds formed at the temperatures used. As such, the thickness of the GeN layer may be below the detection limit of XRD (X-ray diffraction) measurements (see further), e.g. lower than 5 nm. The detection limit depends on the quality of the crystal that is being measured. For good single crystal films typically at least 5 to 10 monolayers are required which corresponds to a thickness of about 3 nm to 5 nm. However, taking into account the structural symmetry and the lattice parameters of the β-phase, this hexagonal phase can be stabilized pseudomorphic on the Ge(111) surface.

The monocrystalline GeN layer formed by the method according to embodiments of the invention is found to be able to reduce the number of surface states which may be present at the Ge surface of the substrate. Therefore, the monocrystalline GeN layer may be used as a passivation layer e.g. for gate passivation in CMOS devices. Because of the ability to passivate surface states at the Ge surface, formation of metal contacts, e.g. Ohmic contacts or Schottky contacts, may be advantageously performed on the monocrystalline GeN layer. With advantageously performed is meant that formation of contacts onto the nitridated Ge substrate, or GeN/Ge substrate, may lead to contacts with better properties than when the same contacts would be formed on bare Ge substrates (see further).

Furthermore, the monocrystalline GeN layer formed by the method according to embodiments of the invention can be used to grow crystalline materials on. Deposition or growth of other materials, e.g. group III-nitrides, on the GeN layer may lead to layers with good quality (see further).

Figure 1B:
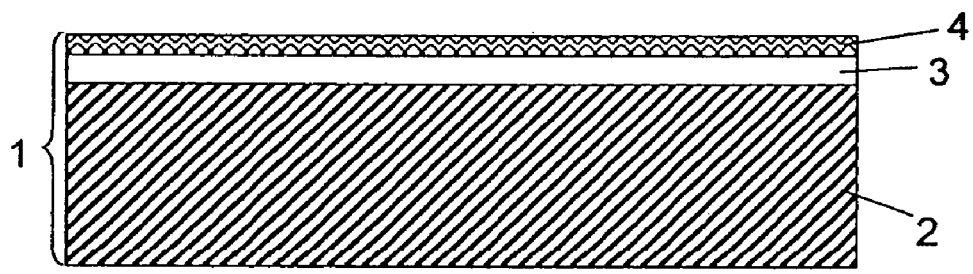
Figure 1C:
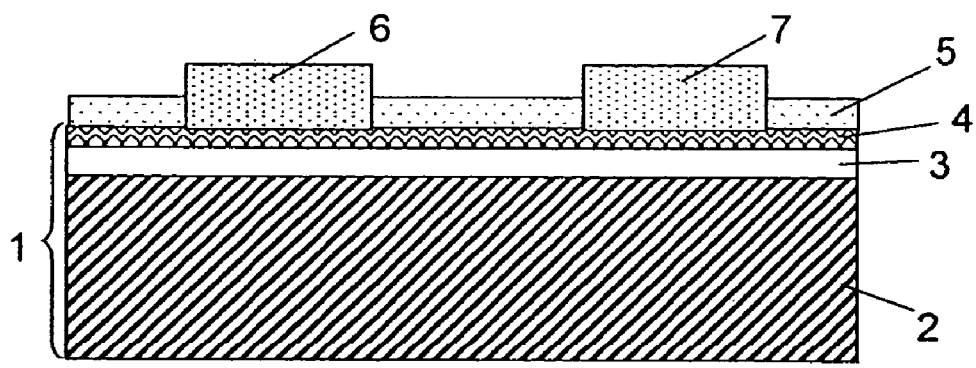

Hereinafter, subsequent steps in methods according to embodiments of the invention will be described. These subsequent steps are illustrated in FIG. 1A to FIG. 1C. It has to be understood that this is only for the purpose of explaining the method and is not intended to limit the invention in any way.

In the example illustrated in FIG. 1A a substrate 1 may be provided: which may be formed by a support 2 with a Ge top layer 3, the Ge top layer 3 having a hexagonal or six-fold symmetry. The Ge top layer 3 may also be referred to as Ge surface 3.

According to embodiments of the invention, nitridation of the Ge top layer 3 is performed, i.e. the Ge top layer 3 is exposed to a nitrogen gas flow at a temperature of between 550° C. and 940° C., preferably between 550° C. and 880° C. or between 600° C. and 880° C., thereby forming a monocrystalline $Ge_3N_4$ layer 4 (see FIG. 1B). The nitrogen gas may comprise N-containing molecules. For example, the nitrogen gas flow may comprise $N_2$ or $NH_3$. As nitrogen gas molecules (such as $N_2$ or $NH_3$) are relatively stable the nitrogen molecules from the nitrogen gas flow have to be split into atomic nitrogen atoms to bind more easily to the Ge top layer 3 of the substrate 1. This can be done in a plasma or by thermally cracking in front of the substrate 1, for example by using high substrate temperatures, or in a plasma cell. Preferably cracking of $N_2$ may be done in a plasma and preferably cracking of $NH_3$ may be done by thermally cracking in front of the substrate 1, for example by using high substrate temperatures, or in a plasma cell The nitrogen gas flow may be maintained during cooling down of the substrate in order to stabilise the GeN layer 4. In other words, stabilisation of the GeN layer 4 is possible if the substrate 1 is being exposed to the nitrogen gas flow until the substrate 1 has cooled down to a temperature below 650° C., in particular below 600° C. or below 550° C. Maintaining a nitrogen gas flow towards the Ge top layer 3 during cooling down to temperatures below 650° C., in particular below 600° C. or below 550° C., may balance the evaporation of GeN and therefore may lead to the formation of monocrystalline GeN. That way a thin monocrystalline GeN layer 4 can be formed and maintained.

Dependent on the flow and accordingly the pressure range in which the nitridation step is performed, two regimes can be defined. In Chemical Vapour Deposition (CVD) or Metal Organic CVD, the pressure is ranging from 1 atmosphere down to $10^{-3}$ mbar and the transport of the ammonia occurs by viscous flow. If the pressure becomes smaller than $10^{-3}$ mbar, like is the case for, for example, High Vacuum (HV) or Ultra HV systems, the interactions between the different species (atoms, molecules or ions) become negligible and consequently the gas transport may occur by a molecular flux. For example, when plasma assisted MBE is used, the nitrogen molecules from the nitrogen gas flow are split into atomic nitrogen atoms. In the case of ammonia MBE, $NH_3$ is split at the substrate 1 or in a cell by increased temperature into atomic nitrogen. This allows Ge atoms of at least one upper layer of the Ge top layer 3 to be transformed into GeN, thereby forming a thin GeN layer 4 on the Ge top layer 3 of the substrate 1 (see FIG. 1B):

In the case of ammonia annealing in a CVD system, the ammonia is injected in the deposition chamber and dissociated at the Ge top layer 3 at high temperature between 550° C. and 940° C. to transform at least an upper part of the Ge surface into GeN.

The time period during which the Ge top layer 3 of the substrate 1 is exposed to the nitrogen gas flow, also referred to as exposure time, may depend on the substrate temperature during nitridation and on flow parameters of the nitrogen gas flow. The nitrogen gas flow may preferably be between 1 sccm and 2 sccm (Standard Cubic Centimeters per Minute). However, a nitrogen gas flow of higher than 2 sccm or lower than 1 sccm may also be used in the method according to embodiments of the invention. Preferably, the exposure time may vary between 1 sec and 30 min, in particular between 30 sec and 2 min, and may, for example, be 60 sec. However, according to other embodiments of the invention, shorter or longer exposure times may be used depending on the nitrogen gas flow and nitridation temperature. When, for a given nitrogen gas flow, the exposure time is too short a layer 4 of GeN will not be formed. On the other hand, when, for a given nitrogen gas flow, the exposure time is long, the surface of the GeN layer 4 may become rough.

By controlling the nitrogen gas flow, the temperature at which nitridation is performed and the time during which nitridation is performed, the properties such as e.g. thickness of the GeN layer 4 may be well controlled. By controlling the nitridation parameters, the GeN layer 4 formed on the substrate 1 may have a smooth surface. With smooth surface is meant that the roughness of the GeN surface may be not higher than 0.2 nm, in particular not higher than 1 nm and may for example be about 0.4 nm.

The thin GeN layer 4 may have a thickness of between 0.1 nm and 100 nm, or between 0.3 nm and 10 nm or between 0.1 nm and 0.5 nm and in particular between 0.1 nm and 2 nm. The thickness of the GeN layer 4 is determined by the duration and temperature of the nitridation step and by the nitrogen gas flow during the nitridation step.

At nitridation temperatures above 550° C., and more preferably above 600° C., Reflection High Energy Electron Diffraction (RHEED) experiments on a Ge(111) substrate indicate that during nitridation a reorganisation occurs at the surface of the substrate 1. This is reflected by the presence of intermediate streaks in between Ge streaks in the RHEED diffraction pattern. During nitridation the distance between the main Ge streaks does not change, this shows that the formed GeN grows pseudomorphic and takes over the same in-plane lattice parameters as the underlying Ge top layer 3. As already mentioned before, the monocrystalline GeN layer 4 formed according to embodiments of the invention may be used as a passivation layer for passivation of surface states. With passivation of the surface states is meant in this context that the number of surface dangling bonds may be reduced. This decreases the effect of the surface states on the barrier height. It is known that there are many surface states present at a Ge surface, which prevent proper operation of devices, e.g. semiconductor devices, formed on the substrate when these are not passivated properly. In particular, this may, for example, be a problem for n-Ge for n-MOS devices because the high density of negative charges at an un-passivated or not well passivated surface makes inversion of a p-Ge channel difficult.

I-V (current-voltage) measurements and C-V (capacitance-voltage) measurements indicate that a monocrystalline GeN layer 4 passivates surface states at the Ge surface. C-V measurements show a large hysteresis for bare Ge, indicating a lot of traps in the structure. Samples with GeN show an improved characteristic, i.e. smaller hysteresis. This will be described in more detail in the experiments further in this description.

The method according to embodiments of the invention may be used in the formation of Ohmic and Schottky contacts on a substrate 1 comprising at least a Ge top surface 3. It has been found that the barrier height in metal/Ge contacts shows a weak dependency on the metal workfunction indicating strong Fermi-level pinning because of a high amount of surface states. Consequently it is difficult to realise good Ohmic contacts on Ge. With good Ohmic contacts is meant contacts with low contact resistance of lower than 500 Ohm, preferably lower than 250 Ohm and most preferably lower than 150 Ohm.

The electron affinity of Ge is 4.0 eV. Contacts that are, in theory, expected to form a rectifying contact or an Ohmic contact on n-Ge based on the difference in workfunction of the metal and the electron affinity of the semiconductor may, in practise, not show this behaviour because of the presence of Ge surface states which are fixing the barrier height. This phenomenon is known by a person skilled in the art. Hence, in practise, the barrier height of a metal-semiconductor contact or junction is determined by the workfunction of the metal used, the electron affinity of the semiconductor, and the semiconductor surface states. When the surface state density is high, which is the case for Ge (~1e13 $1/(eV\ cm^2)$), the barrier height may become independent of the metal workfunction and the semiconductor electron affinity. The presence of a GeN layer 4 on top of the Ge substrate 1, e.g. Ge(111) substrate, formed by the method according to embodiments of the invention allows passivation of these surface states. With passivation of the surface states is meant that the presence of a monocrystalline GeN layer on the Ge surface can decrease the effect of the surface states. Different metal contacts have been investigated in prior art to reduce the barrier height between the contact and n-Ge, but in all these cases Schottky contacts were realized instead of Ohmic contacts. High resistance values and rectifying behaviour were found for Hf, Ni, Ti, Ta, La, Gd, Ce and Pt on bare Ge substrates, i.e. on Ge substrates without a GeN layer 4 being present (see A. Dimoulas, Applied Physics Letters, 89, 252110, 2006). Theoretically, from the workfunction of the metals in combination with the electron affinity of Ge, rectifying behaviour would be expected, and, without Fermi level pinning, it would be expected that the barrier height and, consequently, also the contact resistance would be lower for Al when compared to Cr, Cr smaller than Au and Pt because of the values for the workfunction of these metals (see further in table 1). This is; however, not the case when such metal contacts are directly formed on a bare Ge substrate (see further).

The situation changes when providing a GeN layer 4 on the Ge surface 3 before forming the contacts. Because formation of a GeN layer 4 on the Ge top surface 3 using the method according to embodiments of the invention allows proper passivation of the surface states present in Ge, the method according to embodiments of the invention may be applied before forming the contacts on the substrate. With passivation of the surface states is meant that the presence of a monocrystalline GeN layer 4 on the Ge surface 3 reduces the number of surface dangling bonds which decreases the effect of the surface states on the barrier height. This may lead to good Ohmic contacts and to good rectifying (Schottky) contacts, depending on the material used to form the contacts. Hence, provision of a monocrystalline GeN layer 4 in between the substrate 1 and the contacts allows making the barrier height of the contact/substrate junction formed more dependent on the metal workfunction. This thus allows making Ohmic or rectifying (Schottky) contacts in an easy way by choosing a metal with an appropriate workfunction.

Conductive materials that can be used for forming contacts on the monocrystalline GeN layer 4, may for example, be metals, such as Au, Al, Cr, Ag, Cu, Pt, Ti, Co, Ni. The contacts can also be formed by a stack of different materials. At the bottom a metal for contacting the Ge or GeN/Ge can be used, for example Au, Al, Cr, Ag, Cu, Pt, Ti, Co, Ni with on top of the metal a layer, which may also be referred to as capping layer, for protecting the contacting materials from oxidation, for example Au or Pt. Also alloys comprising these metals can be used. In fact all conducting materials, such as metals, alloys, semiconductor materials can be used.

Table 1 gives an overview of workfunctions for different metals.

TABLE 1

| Metal | Workfunction (eV) |
|---|---|
| Yb | 2.6 |
| Ta | 4.25 |
| Ag | 4.26 |
| Al | 4.28 |
| Zn | 4.3 |
| Ti | 4.33 |
| Mo | 4.37 |
| Sn | 4.42 |
| W | 4.5 |
| Cr | 4.55 |
| Co | 5 |
| Au | 5.1 |
| Pd | 5.12 |
| Cu | 4.65 |
| Ni | 5.15 |
| Pt | 6.35 |

When providing a GeN layer 4 on a Ge surface 3 of the substrate 1 according to embodiments of the invention, Ohmic contacts or contacts with a low resistance can be realized for metals having a workfunction below 4.6 eV. Examples of these metals are Al and Cr. Both on Ge and on GeN/Ge, metals having a workfunction of higher than 5.0 eV show Schottky behaviour. Examples of such metals are Au and Pt. From the above it can be summarized that the presence of a GeN layer 4 in between the substrate 1 and the contact significantly lowers the barrier height in case of Al and Cr contacts in respect with Al and Cr contacts on bare Ge. For contacts formed of Au and Pt, which are metals with a higher workfunctions than Al and Cr, the barrier height is larger and therefore a clear Schottky behaviour is observed. This will all be described more in detail in the experiments further in this application.

The ability to reduce the influence of surface states at the Ge surface can be suitable for being used in, for example, MOSFETs. Despite significant progress in Ge p-channel transistors, the n-channel MOSFETs obtained up till now are barely functional and often exhibit low channel mobility (e.g. 100 $cm^2$/Vs as mentioned in IEEE electron device letters, vol. 25, no. 3, March. 2004) and low ON-state currents of about 11 μA (0.4V) for a gate length of 100 μm and a width/length ratio of ~9. The lack of a suitable method to form good Ohmic contacts on n-type Ge limits the ON-state currents. Ohmic contacts are very important for MOSFET structures as source and drain contact and for connecting semiconductor devices with the outside world.

Furthermore, the ability to reduce the influence of surface states at the Ge, surface can also be suitable for being used in Metal-Insulator-Semiconductor (MIS) structures are used in MISFET (Metal-Insulator-Semiconductor Field Effect Transistor) structures, of which a MOSFET is a particular example, e.g. as a gate. The MISFET, in conjunction with other circuit elements, is capable of signal-power and voltage gain and is also used in digital circuit applications as switching device. By applying a voltage to the metal, carriers can be attracted or repelled in the semiconductor underneath the gate. By this, current trough the channel between a drain and source contact can be allowed or obstructed. The insulator between the metal and semiconductor limits the current flowing from the gate to the drain or source. Surface states at the insulator-semiconductor interface will limit the switching speed of this device. Reduction of these surface states will allow higher switching speeds and thus faster devices. Reduction of surface states present at the interface can be obtained by passivating the Ge surface 3 before deposition of the insulator. In experiment 1 (see further) it is shown that a MIS structure, i.e. MOSFET, with nitridated Ge surface shows less influence of trap or surface states than for a Ge surface without nitridation. As an insulator SiO, SiN, HfO, GdO, etc. can be used.

According to embodiments of the invention, other materials may be deposited onto the monocrystalline GeN layer 4. When formed on, for example, a Ge(111) with a hexagonal symmetry, the presence of a GeN layer 4 on the Ge surface 3 of the substrate 1 allows the growth of high quality materials such as e.g. high quality group III nitrides. In the following GaN will be used as an example, but any suitable material can be deposited onto the monocrystalline GeN layer 4. GeN may also improve the crystal quality of other crystalline materials, grown on the monocrystalline GeN layer 4, that have a lattice that matches that of the GeN structure. For example, the presence of a monocrystalline GeN layer 4 on, a Ge(111) surface 3 with hexagonal symmetry enables crystalline growth of GaN 5. FIG. 1C illustrates the provision of a layer 5 of GaN onto the monocrystalline GeN layer 4. This may be done by simultaneously exposing the GeN/Ge substrate to a nitrogen gas flow and a Ga gas flow while heating the substrate 1. Preferably, the Nitrogen gas flow and Ga gas flow may have a comparable atomic flux. In other words, the atomic ratio of the nitrogen gas flow and the Ga gas flow may be 1/1. This may lead to good crystal quality because the atomic ratio Ga and N in the deposited GaN layer 5 may also be 1/1 and fewer defects may be present in the lattice of the deposited GaN layer 5 than when the atomic ratio of the nitrogen gas flow and the Ga gas flow would be different from 1/1. Nevertheless, according to embodiments of the invention, a nitrogen or Ga excess flux or nitrogen and Ga gas flow with an atomic ratio different from 1/1 may be used as well.

During deposition of the GaN layer 5, the substrate 1 may be heated to a deposition temperature which may be between 100° C. and 940° C., between 400° C. and 940° C., preferably between 550° C. and 850° C. and which may, for example, be 700° C. During deposition, the pressure in the deposition chamber may be between $10^{-6}$ Torr and $10^{-4}$ Torr and may preferably be between $1.10^{-5}$ Torr and $5.10^{-5}$ Torr. However, according to embodiments of the invention, higher or lower pressures may also be used. The deposition rate of GaN may be between 10 nm/h and 2000 nm/h, preferably between 180 and 690 nm/h, depending on the deposition parameters such as pressure; temperature and gas flow. However, according to embodiments of the invention, lower or higher deposition rates may also be possible.

The thickness of the GaN layer 5 depends on the deposition rate and the deposition time and may be between 0.5 nm and 1 cm, preferably between 0.5 nm and 100 μm, more preferably between 0.5 nm and 10 um, or even more preferably between 0.5 nm and 1000 nm, between 0.5 nm and 500 nm, between 0.5 nm and 100 nm, between 0.5 nm and 20 nm, between 0.5 nm and 10 nm, between 0.5 nm and 2 nm, or may have a thickness corresponding to between 1 and 5 monolayers. The deposition time required is determined by the deposition rate and by the required thickness for the GaN layer 5 for particular applications. The smooth surface of the GeN layer 4 makes sure that the GaN layer 5 which is deposited subsequently will have good crystal quality.

According to embodiments of the invention, the GaN layer 5 may be doped. This may be done during deposition or growth of: the GaN layer 5. Efficient n- and p-type doping is of importance for the fabrication of electronic devices. Doping of the GaN layer 5 may be achieved by introducing foreign elements into the GaN during growth or afterwards by, for example, ion implantation. Examples of elements for doping GaN are Si for forming n-type GaN or Mg for forming p-type GaN. It has to be noted that p-GaN is difficult to grow or deposit because of a high n-type background doping density (non intentionally) which must be compensated for. As it is hard to make p-GaN, it is difficult to realise a p/n-GaN junction. It is also difficult to make a p/n heterojunction comprising an n-GaN layer on a p-type material due to structural differences. As the method according to embodiments of the invention makes it possible to deposit high quality n-GaN on a Ge substrate, a p/n heterojunction, e.g. n-GaN/p-Ge, with high quality can be made.

By first forming a GeN layer 4 on a Ge surface 3 of the substrate with the method according to embodiments of the invention, GaN layers 5 with good crystal quality can be deposited on the substrate 1. This is concluded from X-ray diffraction (XRD) omega and XRD omega-2theta scan experiments (see further). For example, for GaN layers 5 with a thickness of e.g. 40 nm, XRD full widths at half maximum (FWHM) of the omega, scan may be between 100 and 1000 seconds, preferably between 200 and 700 seconds and more preferably between 300 and 600 seconds. Low XRD FWHM values indicate a good nicely repeated crystal structure. Hence, the lower these XRD FWHM values are, the better the crystal quality of the GaN layer 5 will be and the more suitable the GaN/Ge structure formed will be for use in e.g. semiconductor devices. This is because of the better electrical properties due to higher electron mobility. For thick GaN layers 5 of a few microns thickness deposited on Si or on sapphire according to prior art methods XRD FWHM values of the omega scan of 300 to 600 arcseconds have been measured. For bulk GaN layers 5 with a thickness of a few 100 μm XRD FWHM values of 200 to 300 can be obtained.

According to embodiments of the invention, the GaN layer 5 may be patterned to expose parts of the GeN layer 4. Subsequently, contacts 6, 7 as described earlier may be provided onto the parts of the GeN layer 4 which have been exposed. The contacts 6, 7 formed may, depending on the material used to form the contacts 6, 7 and as described above, be Ohmic contacts or Schottky contacts. This is illustrated in FIG. 1C.

Hereinafter, some experiments will be described. It has to be understood that these experiments are only for the ease of explaining and understanding the invention and are not intended to limit the invention in any way.

EXPERIMENT 1

In a first experiment, the influence of the presence of a GeN layer 4 on C-V measurements was measured to show that a monocrystalline GeN layer 4 formed with the method according to embodiments of the invention passivates surface states present at the Ge surface 3.

Two crystalline n-Ge(111) (~0.1 Ohm·cm) samples were prepared. One sample was nitridated at a temperature of between 700° C. and 800° C. at a pressure of around 1e-5 torr. The other sample was annealed at a temperature of 700° C. in vacuum of ~1e-9 Torr to degas the sample and to remove native GeO present at the Ge surface 3. Immediately after unloading, ~20 nm $SiO_2$ was deposited on both samples as an insulator so as to form a MIS structure, in particular a MOS structure which can be used as a gate in MOSFETs. Subsequently, Au contacts were made onto a front side of both samples, i.e. onto the $SiO_2$. The backside of the samples, opposite to the front side, was covered with AuGe/Ni/Au. Because this AuGe/Ni/Au contact covers a big part of the backside of the sample, the surface area is high, and therefore the contact resistance may be low. In fact, the AuGe/Ni/Au backside contact behaves as an Ohmic contact.

Figure 2:
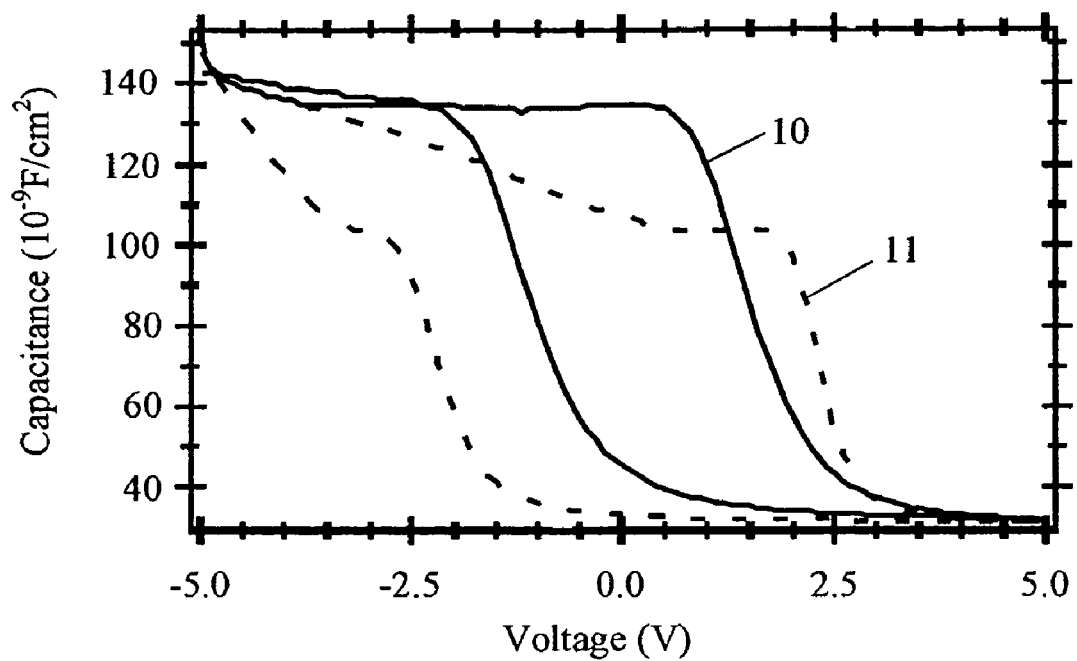
FIG. 2 shows results of C-V measurements performed on Au contacts on Ge (dashed line) and nitridated Ge (full line).

C-V measurements were performed on both samples (see FIG. 2). The voltages are applied to a chuck of the measurement equipment; therefore a positive voltage in the graph corresponds to a negative voltage on the metal. Curve 10 (full line) in FIG. 2 shows the C-V measurement for the sample with a GeN layer 4 and curve 11 (dashed line) shows the C-V measurement for the sample without a GeN layer 4. From the figure it can be seen that the C-V measurements show a large hysteresis for both samples. This hysteresis indicates a lot of traps or surface states present in the structure. The sample with a GeN interlayer 4 shows an improved characteristic with respect to the sample without the GeN interlayer 4, i.e. a smaller hysteresis and a constant capacitance at negative voltages is reached. This indicates that provision of a monocrystalline GeN layer 4 on a Ge substrate 1 may improve the hysteresis for, for example, Metal Oxide Semiconductor (MOS) structures when compared to cases where a Ge substrate 1 was used without nitridation before forming contacts. As the hysteresis of the sample with a GeN layer 4 has improved, i.e. is decreased, with respect to the sample without a GeN layer 4, this shows that the GeN layer 4 passivates at least part of the surface states present at the Ge surface 3 of the substrate 1. The remaining hysteresis of the sample with the GeN layer 4 can be explained by traps or surface states in the oxide and at the interface of the oxide, which was deposited in another system than the system in which the nitridation took place.

EXPERIMENT 2

Figure 3:
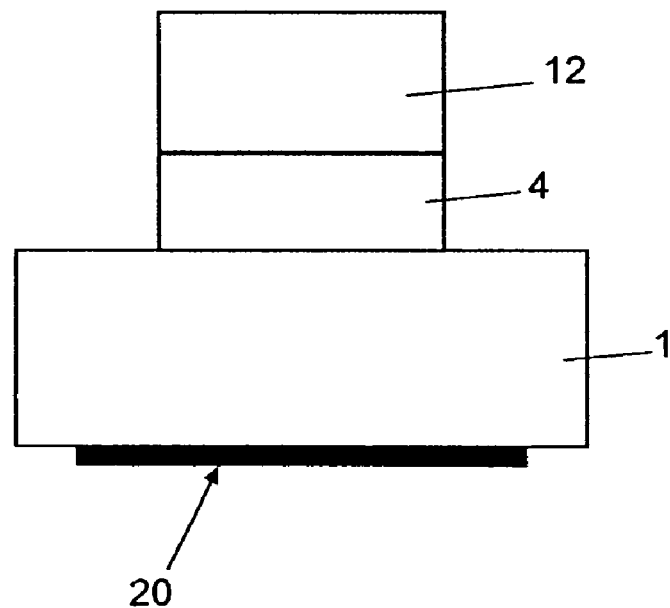
FIG. 3 illustrates an Au/GeN/Ge diode.

In a second experiment, Au/GeN/Ge diodes were formed (see FIG. 3). A Ge(111) substrate 1 was nitrided at a temperature of between 700° C. and 800° C. thereby forming a monocrystalline GeN layer 4 on the substrate 1. Subsequently, a resist was deposited on the GeN layer 4. By means of photolithography, the resist was patterned in the shape of circles with different diameter. An Au layer was deposited on this structure. When the remaining resist is removed Au contacts 12 in the shape of circles remain. Subsequently, mesas are etched by removing the GeN layer 4 around the Au contacts. Hence, Au contacts 6, 7 with different diameter are formed. When I-V measurements are performed, this results in different values for the current for different dot/contact sizes, but the current density should be comparable.

Figure 4:
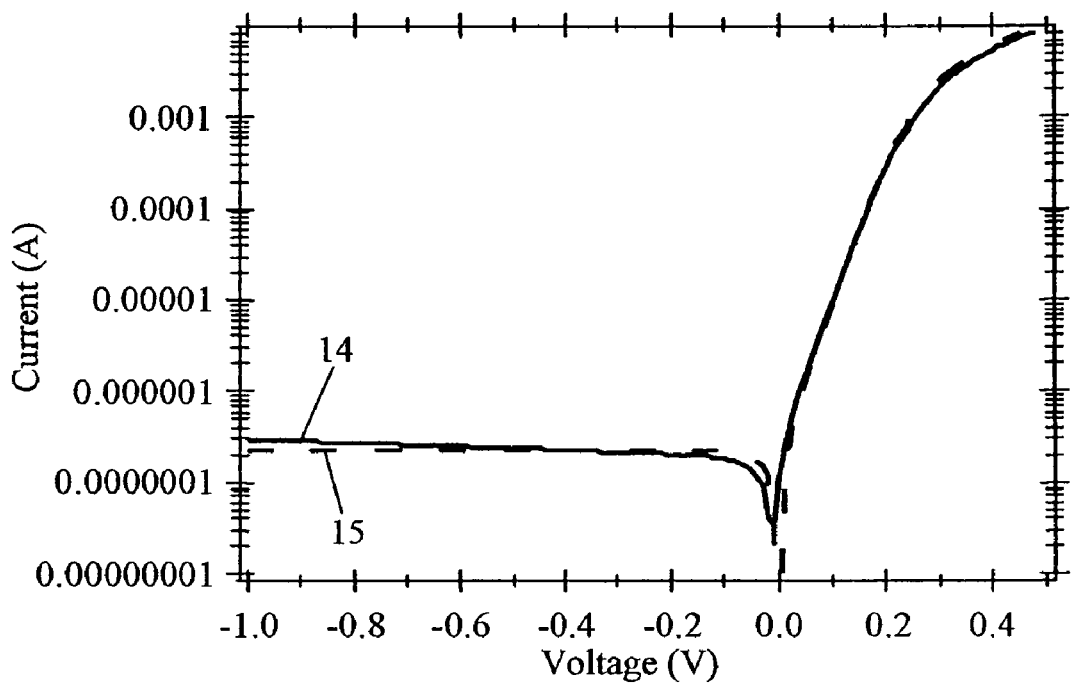
FIG. 4 shows results of I-V measurements performed on the Au/GeN/Ge diode as illustrated in FIG. 3.

I-V measurements on the structure as illustrated in FIG. 3 were done between a 86 μm diameter Au dot and a backside contact 20 on the Ge substrate 1. The I-V curve is shown in FIG. 4. Curve 14 (full line) shows the result of the measurement while curve 15 (dashed line) shows the fit. Fitting was performed by using a Schottky diode (metal/GeN/Ge contact) in series with a resistance Rs (for the substrate resistance, contact resistances). The parameters $I_{st}$ (saturation current), n (ideality factor) and Rs were changed so as to obtain the best fit. The following equation was used:

$$I = I_{st}(e^{\frac{q(V_a - RsI)}{nkT}} - 1) \quad (1)$$

Equation (1) gives the current I as a function of the applied voltage $V_a$ for a Schottky contact in series with a substrate having a substrate resistance Rs. When n equals 1 the Schottky contact is ideal, indicating that no recombination occurs at the interface between the substrate and the Schottky contact forming material.

From the fit of the Au/GeN/Ge diode the ideality factor n is determined to be 1.038, indicating not much recombination at the interface and therefore good Schottky behavior. This shows that the introduction of a GeN layer 4 in between the Au contact 12 and the n-Ge substrate 1 does not suppress the ideal Schottky behavior by limiting the current in forward bias. Therefore the GeN layer 4 allows more control of the barrier height in function of the workfunction of the metal and nice Schottky characteristics at the same time.

Figure 5:
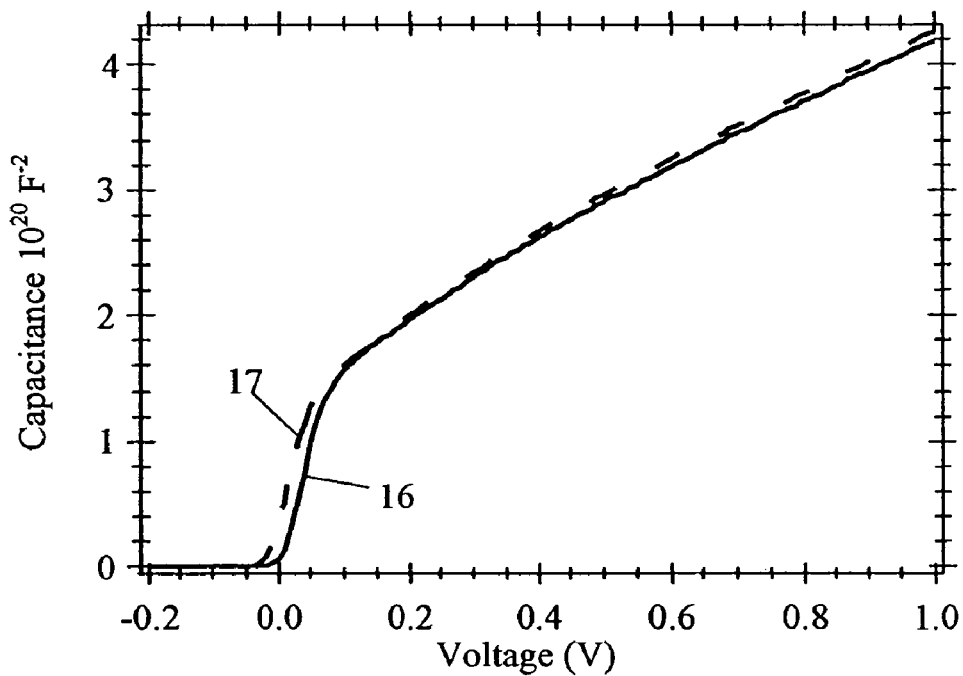
FIG. 5 shows results of C-V measurements performed on the Au/GeN/Ge diode as illustrated in FIG. 3.

FIG. 5 shows C-V measurements for the Au/GeN/Ge diodes illustrated in FIG. 3. Curve 16 (full line) shows the C-V measurement at 500 kHz and curve 17 (dashed line) shows the C-V measurement at 1000 kHz.

I-V (FIG. 4) and C-V (FIG. 5) measurements indicate that Au/GeN/Ge diodes show a Schottky diode behaviour. In this second experiment, also Pt/Ge and Pt/GeN/Ge diodes were made. Therefore, n-type Ge(111) substrates 1 with a resistivity of 0.02-0.2 Ohm·cm and a carrier concentration of 8e15-8e16 carriers/$cm^3$ were used. Just before loading into a UHV (Ultra High Vacuum) system the samples were chemically cleaned to remove metallic contamination, particles and a native Ge oxide from the surface of the substrates 1. Subsequently, the samples were annealed in vacuum (~1e-9 torr) to degas them and to remove the remaining native Ge oxide. The removal of the native oxide was confirmed by RHEED (Reflection High Electron Energy Diffraction), which showed a reconstructed surface, indicating a clean Ge surface. One of the two samples was heated to a temperature of between 700° C. and 800° C. and while being exposed to a nitrogen plasma at a pressure of around 1e-5 torr. From RHEED measurements the formation of a monocrystalline GeN layer 4 could be observed. The second sample was only degassed in the UHV system at a temperature of 700° C. without being exposed to a nitrogen plasma. Finally, the two samples were taken out of the UHV system and immediately loaded into a Metal deposition system where metal dots were deposited on the samples by using a shadow mask (foil with holes with a diameter of, in the example given, 500 μm). Contacts were formed by depositing a 20 nm thick Pt layer with on top a 100 nm thick Au layer through this mask, thereby forming contacts with a diameter of 500 μm. No etching has been done.

Figure 6:
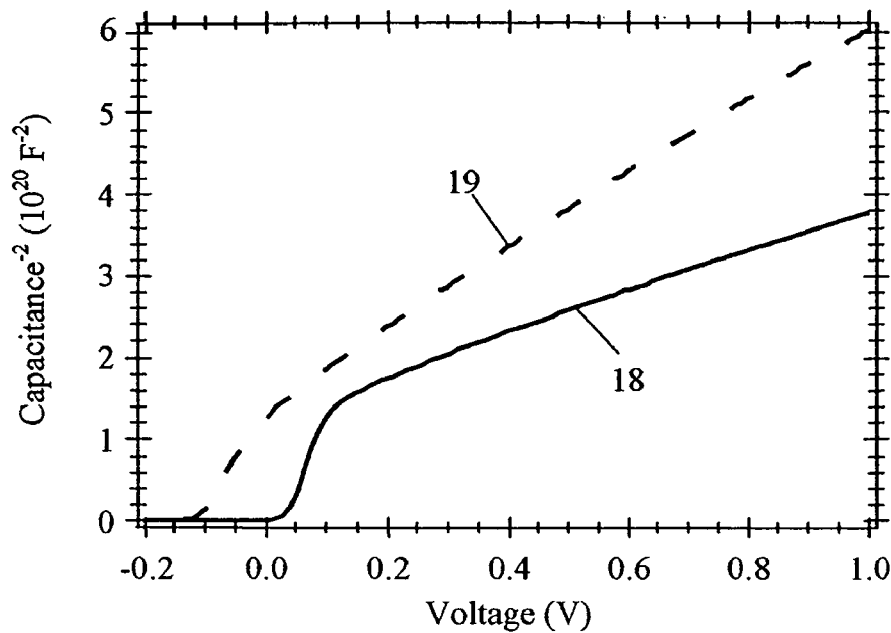
FIG. 6 shows results of C-V measurements on a Pt/GeN/Ge diode.

C-V measurements on both Pt/Ge and Pt/GeN/Ge diodes were performed on the 500 μm diameter contacts (see FIG. 6). Curve 18 (full line) shows C-V measurement for the Pt/GeN/Ge diode and curve 19 (dashed line) shows the C-V measurement for the Pt/Ge diode. The capacitance for the Ge sample which was not subject to nitridation is clearly lower. Negatively charged surface states or traps may increase the depletion region in the n-Ge. This can be seen as an extra capacitance in series which is present for the sample without nitridation when compared to the nitridated sample, which results in a decrease of the total capacitance. From this it can be concluded that the presence of the GeN layer 4 in between the Pt contact and the Ge substrate 1 decreases the number of negatively charged surface traps.

Therefore the presence of the GeN layer 4 allows a better control of the barrier height as a function of the workfunction of the metal. The barrier height can even be reduced such that Ohmic contacts can be realised. The GeN layer 4 gives good Schottky characteristics at the same time.

EXPERIMENT 3

Figure 7:
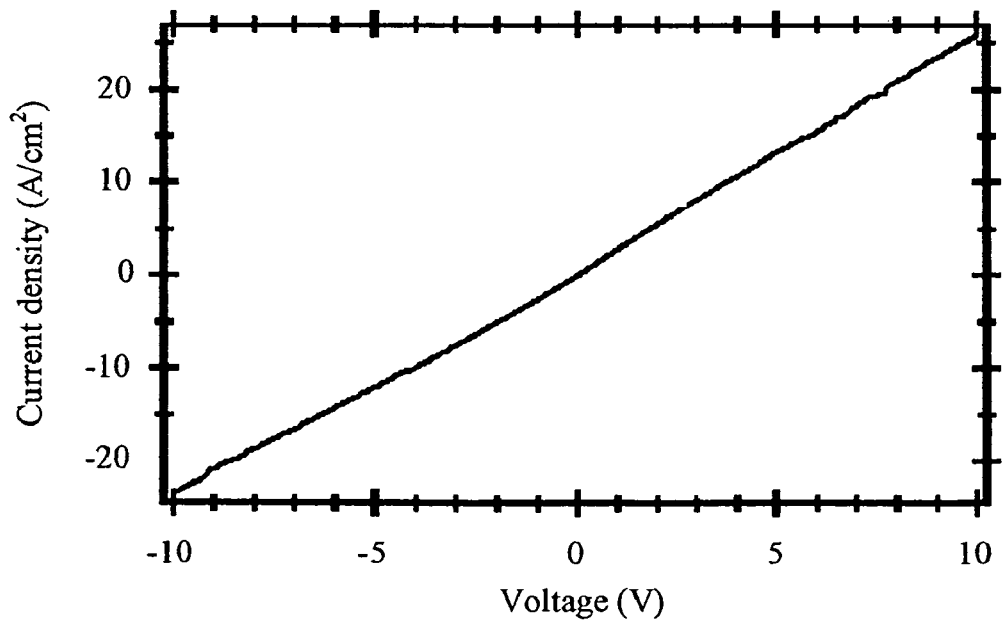
FIG. 7 shows results of I-V measurements between a 500 μm diameter contact on GeN/Ge and the backside of the Ge substrate.
Figure 8:
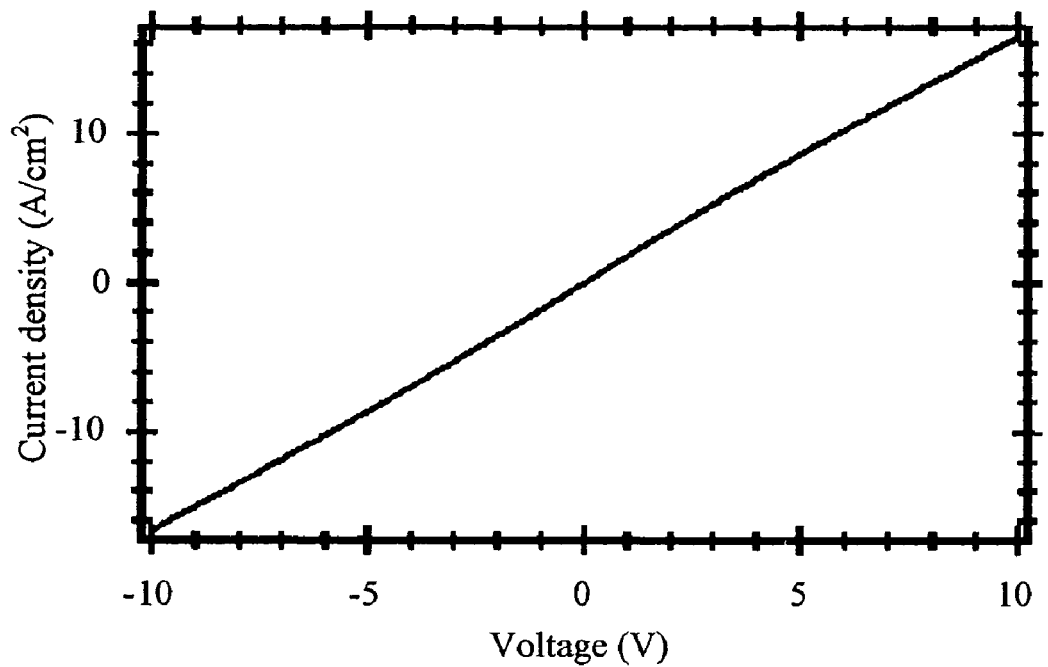
FIG. 8 shows results of I-V measurements between two 500 μm diameter contacts on GeN/Ge.

In a third experiment, a GeN layer 4 was formed onto an n-type Ge(111) substrate 1 during 30 minutes. An n-type Ge(111) substrate 1 with a carrier density of 8e15-8e16 carriers/$cm^3$ was loaded into a Metal Organic Chemical Vapor Deposition (MOCVD) system. Subsequently, the substrate 1 was heated to 800° C. while being exposed to an ammonia flow of 8 slm (Standard Litre per minute) during 30 minutes. Spectroscopic ellipsometry showed the formation of a thin GeN layer 4 on the Ge substrate 1. Contacts with a diameter of 500 µm and comprising a 100 nm thick Al layer with a 100 nm thick Au layer on top were formed on the GeN layer 4. I-V measurements were performed between the 500 µm diameter contacts on GeN/Ge and a backside of the Ge substrate 1 (see FIG. 7). Also I-V measurements were done between two 500 µm diameter contacts (see FIG. 8).

For an Al/GeN/Ge contact, the resistance at −0.5 V is 268 Ohm. The behaviour is clearly linear between −10 V and 10 V (see FIG. 7). The current density at −1 V is −1.8 A/$cm^2$, which is higher than for Al contacts on bare Ge which show a current density of −2.5 mA/$cm^2$. The current density is lower than for Al contacts on Ge nitridated in UHV by plasma (16.6 A/$cm^2$). This is because the latter GeN layer was thinner. -

The resistance between two contacts (FIG. 8) at −0.5 V was much lower than for contacts on a bare Ge surface, for which the resistance was 250000 Ohm. (The resistance was higher than for the samples prepared in the UHV system with a high temperature nitridation (19 Ohm at −0.5 V), probably because this MOCVD layer was thicker (from spectroscopic ellipsometry).

From this experiment it is shown that a GeN layer 4 can be formed on a Ge(111) substrate 1 by exposure of the substrate to ammonia at high temperatures. It is furthermore shown that Al contacts 6, 7 formed on the GeN layer 4 show low contact resistance compared to the same contacts formed on a bare Ge substrate 1.

EXPERIMENT 4

In this fourth experiment, the influence of nitridation of an n-type Ge substrate 1 was analysed with respect to the behaviour of metallic contacts 6, 7. Therefore I-V characteristics for samples with and without nitridation were compared for different metals, i.e. for Al, Au, Cr, Pt and the influence of the presence of a monocrystalline GeN layer 4 in between the substrate 1 and the contacts 6, 7 on the I-V measurements was determined. I-V measurements were carried out between one metal contact 6 and a backside Contact 20 of the Ge substrate 1 as well as between two metal contacts 6, 7. This is schematically illustrated in respectively FIG. 9(a) and FIG. 9(b) for the samples that had the nitridation step and thus comprise a GeN layer 4. On the other samples, a GeN layer 4 is not present and the metallic contacts 6, 7 are in direct contact with the Ge substrate 1. The influence of a monocrystalline GeN layer 4 obtained with the method according to embodiments of the invention as well as the influence of amorphous GeN (obtained from nitridation at low temperature (prior art)) was investigated.

For the fourth experiment, n-type Ge(111) substrates 1 with a resistivity of 0.02-0.2 Ohm·cm and a carrier concentration of 8e15-8e16 carriers/$cm^3$ were used. The samples are chemically cleaned to remove metallic contamination, particles and the native Ge oxide form the surface, just before loading into a UHV (Ultra High Vacuum) system. Subsequently, annealing in vacuum (~1e-9 torr) was done to degas the samples and to remove remaining native Ge oxide. The removal of the native oxide was confirmed by RHEED (Reflection High Electron Energy Diffraction), which showed a reconstructed surface, indicating a clean Ge surface.

For each of the selected metals, two samples were prepared. One of these two samples was heated to a temperature of between 700° C. and 800° C. while being exposed to a nitrogen plasma at a pressure of 1e-5 torr. From RHEED measurements the formation of a monocrystalline layer could be observed. Moreover, X-ray Photoemission Spectroscopy (XPS) measurements revealed the formation of a GeN layer 4 on the Ge substrate 1. The second sample was only degassed in the UHV system at a temperature of 700° C. without being exposed to a nitrogen plasma. Finally, the two samples were taken out of the UHV system and immediately (to prevent formation of GeO) loaded into a metal deposition system where on the two samples metal dots were formed by depositing a metal layer onto a shadow mask. The thickness of the metal layer deposited for forming the metal dots was fixed at 20 nm. In order to prevent the metal from oxidizing, a 100 nm thick Au cap-layer was deposited on top of the metal. The metal dots or contacts formed have a diameter of 500 µm. This experiment was repeated for each of the above-mentioned metals, i.e. for Al, Au, Cr, Pt. Backside metallisation, i.e. formation of a contact on the backside of the Ge substrate 1 was done with AuGe/Ni/Au (120 nm/15 nm/100 nm).

Figure 9:
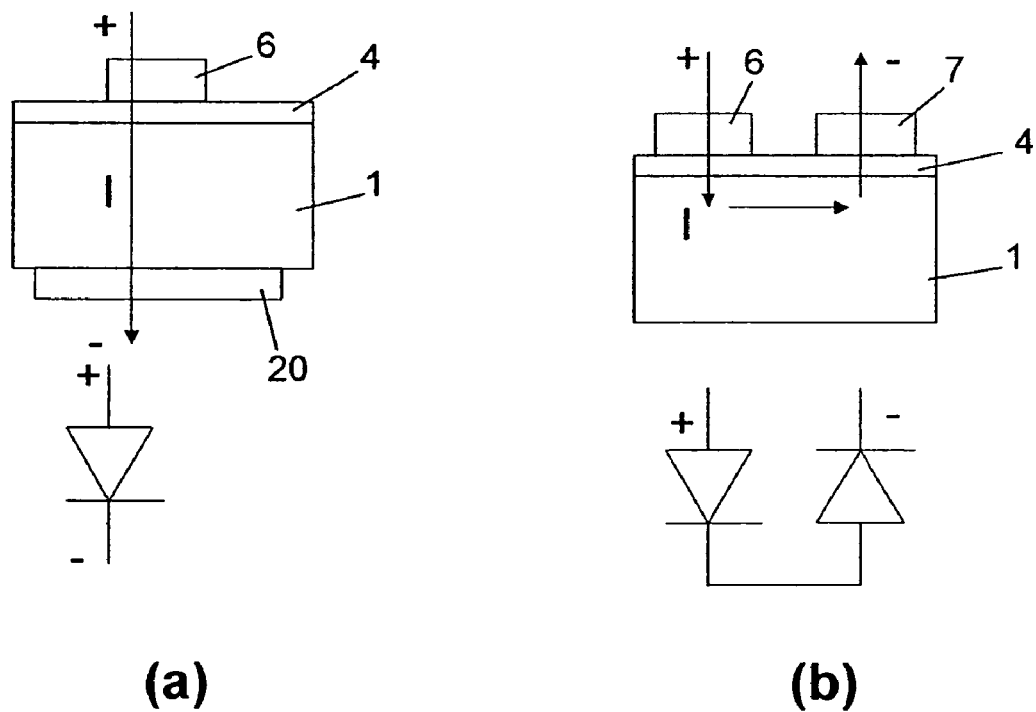
FIG. 9 shows an experimental set-up for measuring I-V characteristics.

I-V measurements were carried out between one metal contact 6 with a diameter of 500 µm (experimental set-up as illustrated in FIG. 9(a)) and a backside contact 20 of the Ge substrate 1 as well as between two metal contacts 6, 7 each with a diameter of 500 µm (experimental set-up as illustrated in FIG. 9(b)). In case of Ohmic contacts, a linear behaviour can be expected in the I-V measurements for both nitridated and non-nitridated samples. In case of a rectifying behaviour of the metal/substrate contact at the front-side of the substrate 1, the schematic representations in FIG. 9 illustrate that a rectifying behaviour will be observed when using backside contacts (FIG. 9(a)) and a low current density will be measured in case of two contacts at the surface (FIG. 9(b)).

The electron affinity of Ge is 4.0 eV. All contacts which were formed in this fifth experiment are, based on the workfunction of the metals used, expected to give a rectifying contact on n-Ge because the workfunction of the different metals used is larger than the electron affinity.

From table 1 it can be seen that the workfunction for Al, Au, Cr, Pt is respectively 4.28 eV, 5.1 eV, 4.55 eV and 6.35 eV. If there would be no surface states present at the surface of the Ge substrate 1, the barrier height would only depend on the workfunction of the metal and the electron affinity of the semiconductor. For example, for Al the difference between the metal workfunction of Al (4.28 eV) and the Ge electron affinity (4.0 eV) is 0.28 eV. Hence, a barrier height of 0.28 eV could be expected for a n-Ge/Al contact in the absence of surface states. The effective barrier height can be deduced from I-V measurements, and are given in Table 3 below.

Figure 10:
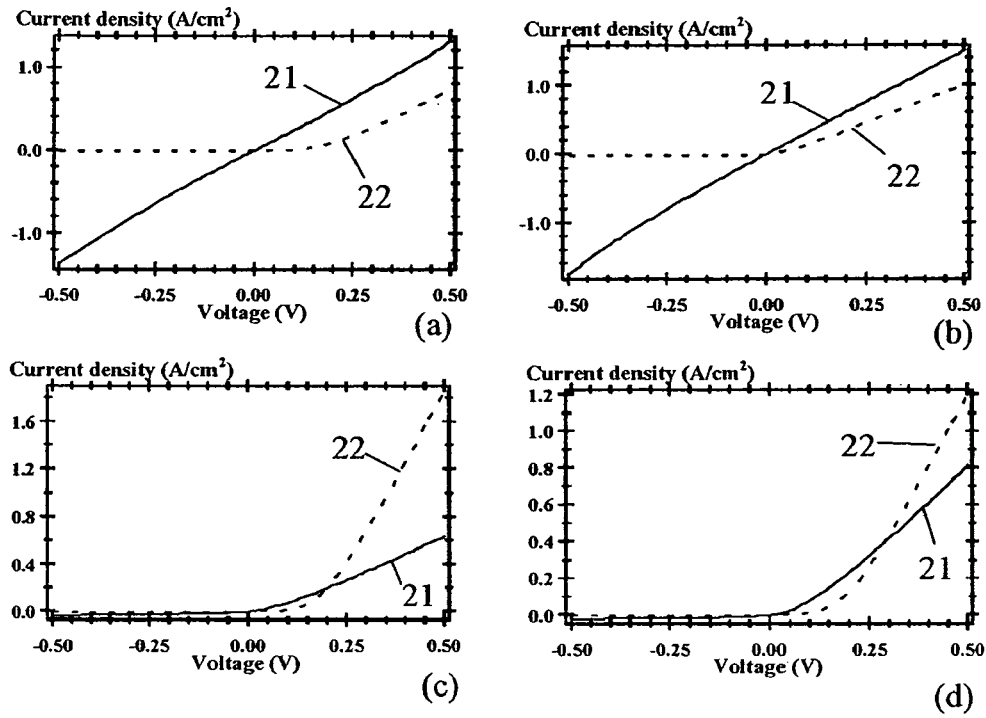
FIG. 10 shows results of I-V measurements between 500 μm metal contacts on a Ge substrate with and without nitridation and the backside of the Ge substrate.

I-V measurements between a metal contact 6 and a backside contact 20 of the Ge substrate 1 were performed for the different metals mentioned above. In case of Ohmic contacts, a linear behaviour can be expected in these I-V measurements. The metal/Ge contact at the backside of the Ge substrate 1 covers the complete backside and thus has a large surface area. Therefore, Ohmic behaviour can be observed for this contact. The I-V measurements between a metal contact 6 and a backside contact 20 of the Ge substrate 1 are shown in FIG. 10. FIG. 10(a) shows I-V measurements for Al/GeN/Ge (curve 21) and Al/Ge (curve 22), FIG. 10(b) for Cr/GeN/Ge (curve 21) and Cr/Ge (curve 22), FIG. 10(c) for Au/GeN/Ge (curve 21) and Au/Ge (curve 22) and FIG. 10(d) for Pt/GeN/Ge (curve 21) and Pt/Ge (curve 22). From the figures it can be seen that Al and Cr contacts show rectifying behaviour when formed directly onto a bare Ge surface but show Ohmic behaviour when formed on a nitridated Ge substrate 1, or in other words, when formed on a GeN layer 4 formed by the method according to embodiments of the invention. This is also indicated in Table 2 below, where results of the I-V measurements are summarized. Table 2 shows the resistance between a 500 μm diameter contact 6 and a backside contact 20 of the Ge substrate 1 at −1V (needle on the 500 μm contact is at −1 V, the chuck is grounded) is given, as well as the corresponding current density for the different metals used to form contacts both on bare Ge and on GeN/Ge.

TABLE 2 results from I-V measurements using diferent contacting materials

| | Substrate | | | |
|---|---|---|---|---|
| | Ge substrate | | GeN/Ge | |
| | measurement | | | |
| IV curve | current density resistance | | substrate IV curve | current density resistance |
| Al/Au rectifying | 4.5e-3 A/cm² 113083 Ohm | | Ohmic | 3.4 A/cm² 149 Ohm |
| Cr/Au rectifying | 3.03E-2 A/cm² 16827 Ohm | | Ohmic | 4.5 A/cm² 114 Ohm |
| Au/Au rectifying | 4.6e-3 A/cm² 109754 Ohm | | rectifying | 4.6e-2 A/cm² 10989 Ohm |
| Pt/Au rectifying | 4.1e-3 A/cm² 124780 Ohm | | rectifying | 2.8e-2 A/cm² 18455 Ohm |

In case of metal contacts on a bare Ge substrate, in all cases high resistance values, i.e. resistance values of higher than 16000 Ohm, and low current densities, i.e. current densities of lower than 5e-2 A/cm² are found, indicating that a rectifying behaviour is obtained. In case of Al and Cr contacts on a GeN/Ge substrate, much lower resistance values, i.e. resistance values of lower than 150 Ohm, and much higher current densities, i.e. current densities of higher than 3 A/cm², are found, indicating a low resistance, Ohmic metal contact. For Au and Pt contacts on GeN/Ge, high resistance values, i.e. resistance values of higher than 10000 Ohm, and low current densities, i.e. current densities of lower than 5e-2 A/cm², are observed.

The different behaviour of Al and Cr when compared to Au and Pt may be explained by the different workfunctions of these metals (see Table 1). Al and Cr have a lower workfunction than Au and Pt. The data in FIG. 10 and Table 2 indicate that the GeN passivation lowers the barrier height for Al and Cr contacts significantly with respect to Al and Cr contacts formed on a bare. Ge substrate. For Au and Pt, which are metals with a higher workfunction than Al and Cr, the barrier height is larger and therefore a clear Schottky behaviour is observed. An overview of the barrier heights of the contacts formed in this experiment is given in Table 3.

TABLE 3

Overview of barrier heights for different contacts.

| Metal | Barrier height (eV) - no GeN | Barrier height (eV) - With GeN |
|---|---|---|
| Al | 0.56 | 0 |
| Cr | 0.51 | 0 |
| Au | 0.56 | 0.5 |
| Pt | 0.56 | 0.51 |

Figure 11:
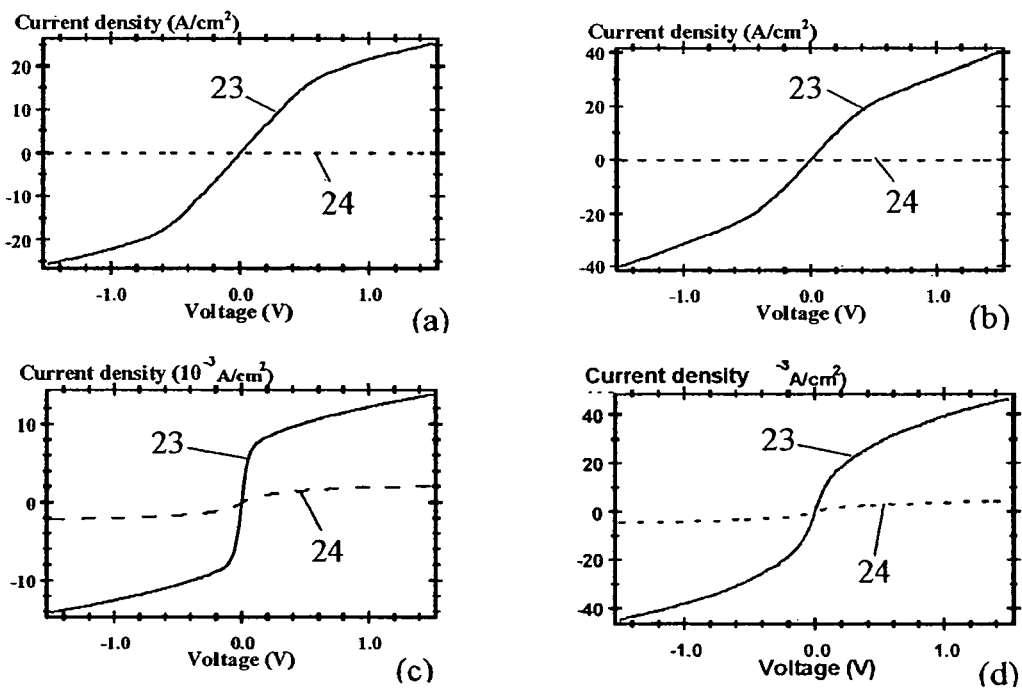
FIG. 11 shows results of I-V measurements between two 500 μm diameter metal contacts on a Ge substrate with and without nitridation.

I-V measurements were also performed between two metal contacts 6, 7 (see experimental set-up as illustrated in FIG. 9(b)). The results of these I-V measurements are shown in FIG. 11. FIG. 11(a) shows I-V measurements for Al/GeN/Ge (curve 23) and Al/Ge (curve 24), FIG. 10(b) for Cr/GeN/Ge (curve 23) and Cr/Ge (curve 24), FIG. 10(c) for Au/GeN/Ge (curve 23) and Au/Ge (curve 24) and FIG. 10(d) for Pt/GeN/Ge (curve 23) and Pt/Ge (curve 24). The resistance determined at 0.5 V is shown in Table 4 below. In case of Ohmic contacts, as is the case for Al/GeN/Ge contacts and Cr/GeN/Ge contacts (see above), a linear behaviour can be expected in the I-V measurements. In FIG. 11(a), i.e. in case of Al/GeN/Ge contacts, a linear behaviour can be observed between −0.5 V and +0.5 V. In FIG. 11(b), i.e. in case of Cr/GeN/Ge contacts, a linear behaviour can be observed between −0.4 V and +0.4 V.

TABLE 4

Resistance between two 500 μm diameter metal contacts at 0.5 V

| Metal | Resistance (Ohm) on bare Ge | Resistance (Ohm) on nitridated Ge |
|---|---|---|
| Al | 294222 | 17 |
| Cr | 10147 | 12 |
| Au | 166572 | 25084 |
| Pt | 83661 | 8720 |

In case of a rectifying behaviour or Schottky behaviour of the metal/substrate contact, which is the case for Au/GeN/Ge and Pt/GeN/Be contacts (see above), the current will be low in reverse (negative voltages). When measuring an I-V curve between two contacts 6, 7 formed on a GeN/Ge substrate 1, one will be in forward and one in reverse (in the case of a positive voltage and a negative voltage). Because one Schottky contact is always in reverse, a low current density and a high resistance will be measured in case of two contacts at the surface. The current flows through the metal/GeN/Ge junction at the left side and comes back trough the metal/GeN/Ge junction at the right side, as illustrated in FIG. 9(b). As a result a symmetric I-V curve is measured, even in the case of a Schottky contact. However, in case of Schottky contacts, the current density will be much lower than for Ohmic contacts or contacts with a small barrier height.

From FIG. 11 and Table 4, it can be seen that the resistance between Al and Cr contacts and the Ge substrate 1 is much lower in case a GeN layer 4 is present on the Ge substrate 1, indicating Ohmic behaviour. Providing a GeN layer 4 in the Ge substrate 1 significantly decreases the resistance between the metal contact 6, 7 and the Ge substrate 1, especially in the case of Al and Cr. For metals with a higher workfunction, such as Au and Pt, the resistance between the metal contact 6, 7 and the Ge substrate 1 is higher than in the case of metals with a lower workfunction (Al and Cr. From these experiments it can be concluded that the presence of a monocrystalline GeN layer 4 formed according to embodiments of the present invention on n-Ge(111) substrates 1 lowers the contact resistance of metal contacts 6, 7 compared to the contact resistance of metal contacts formed on bare n-Ge substrates for metals with workfunction that are low enough (lower than that of Au), for example Al and Cr.

EXPERIMENT 5

The data described above in experiment 4 for Al contacts on GeN/Ge substrates were compared with data for other contacts which are often being used for contacting n-Ge with the aim of a low resistance. To lower the resistance of contacts on Ge, specific choices of materials are being used, such as AuGe/Ni/Au or Ni, combined with annealing the contacts after formation to further reduce the resistance.

To form AuGe/Ni/Au contacts on Ge the following processing steps were performed. A n-type Ge(111) substrate 1 with a carrier concentration of 8e15-8e16 carriers/cm$^3$ was dipped in water to remove native Ge oxide. Subsequently, a metal stack comprising AuGe/Ni/Au was deposited through a shadow mask followed by annealing at 380° C. in forming ($N_2/H_2$) gas. Annealing of this metal stack mixes the different materials and lets them diffuse into the Ge substrate. This lowers the contact resistance.

For contacting Ge with Ni, processing was done as follows. Another n-type Ge(111) substrate 1 with a carrier concentration of 8e15-8e16 carriers/cm$^3$ was also dipped in water to remove native Ge oxide. Subsequently, Ni was deposited through a shadow mask followed by annealing at 350° C. in nitrogen. As Ni has a higher workfunction (5.15 eV) than the electron affinity of Ge (4.0 eV), the contact formed would be expected to show Schottky behaviour on n-Ge in the absence of surface traps at the Ge surface. Annealing leads to formation of NiGe, which lowers the contact resistance.

I-V measurements were done on both samples between metal contacts, i.e. respectively the AuGe/Ni/Au contacts and the Ni contacts, on the Ge substrate 1 and a backside contact of the Ge substrate 1 at −1V. The resistance of the AuGe/Ni/Au and Ni contacts was then compared to the resistance of a 20 nm thick Al contact with 100 nm Au on top on a bare. Ge substrate 1 and on GeN/Ge substrate according to the processing described above (see experiment 4). The results are summarized in Table 5.

TABLE 5

Current density between a metal contact and a backside contact of the Ge substrate at −1 V

| Metal | Substrate | Current density |
|---|---|---|
| Al | Ge/GeN | 3.4 A/cm2 |
| Al | Ge | 4.5e−3 A/cm2 |
| AuGe/Ni/Au with anneal | Ge | 4.0e−2 A/cm2 |
| Ni with anneal | Ge | 2.2e−3 A/cm2 |

Figure 12:
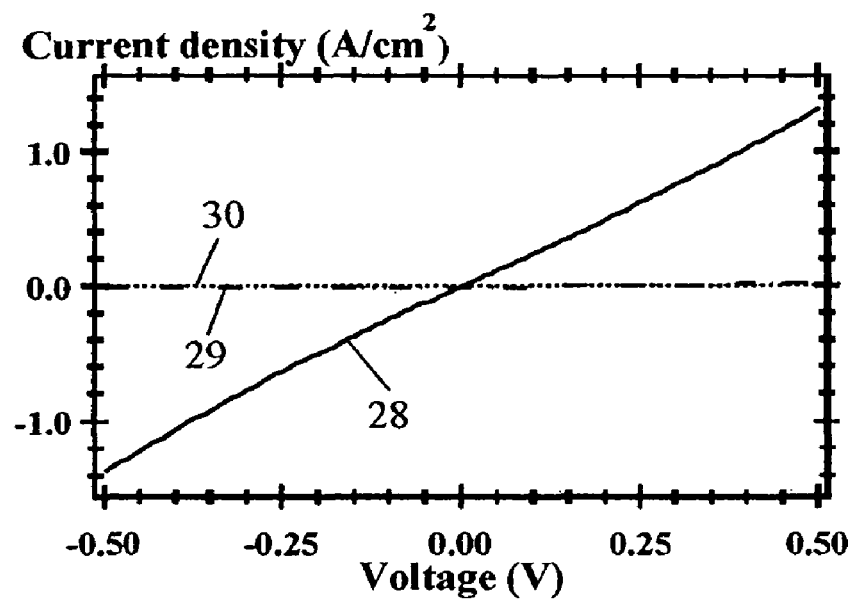
FIG. 12 shows results of I-V measurements between a top contact and the backside of the Ge substrate.

In the case of Al contacts, no annealing or other treatments were done after deposition of the Al. I-V characteristics show that the resistance of the Al/GeN contact is much lower than the other contacts often used for contacting Ge. FIG. 12 shows results of an I-V measurement between a top contact 6 and a backside contact 20 on the Ge substrate 1. Curve 28 shows I-V measurements for an Al/GeN/Ge contact, curve 29 for a Ni/Ge contact after anneal and curve 30 for an AuGe/Ni/Au/Ge contact after anneal.

From these experiments it can be concluded that the presence of a monocrystalline GeN layer 4 formed by the method according to embodiments of the present invention on an n-Ge(111) substrate 1 provides high current densities of 3.4 A/cm2 and thus low contact resistance. The current density obtained at Al/n-GeN/Ge contacts is much higher than for Al contacts on bare Ge substrates or AuGe/Ni/Au contacts and the Ni contacts used in prior art for lowering contact resistance (see Table 5). This indicates that Ohmic or low resistance contacts can be formed by first forming a GeN layer 4 on the Ge substrate 1 with the method according to embodiments of the present invention before forming the contacts. This may be more easy and cheaper than the requirement to form AuGe/Ni/Au contacts.

EXPERIMENT 6

Figure 13:
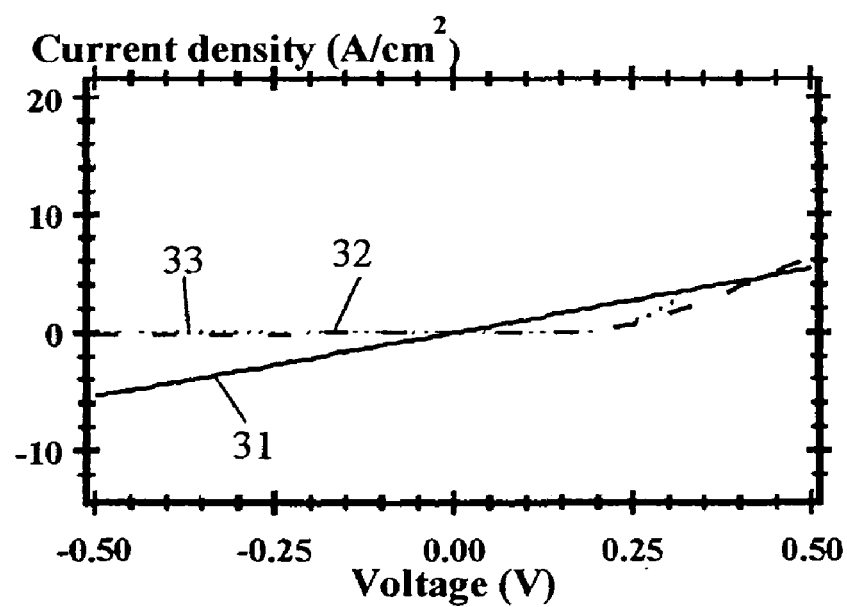
FIG. 13 shows results of I-V measurements between a 500 μm contact and the backside of the Ge substrate.
Figure 14:
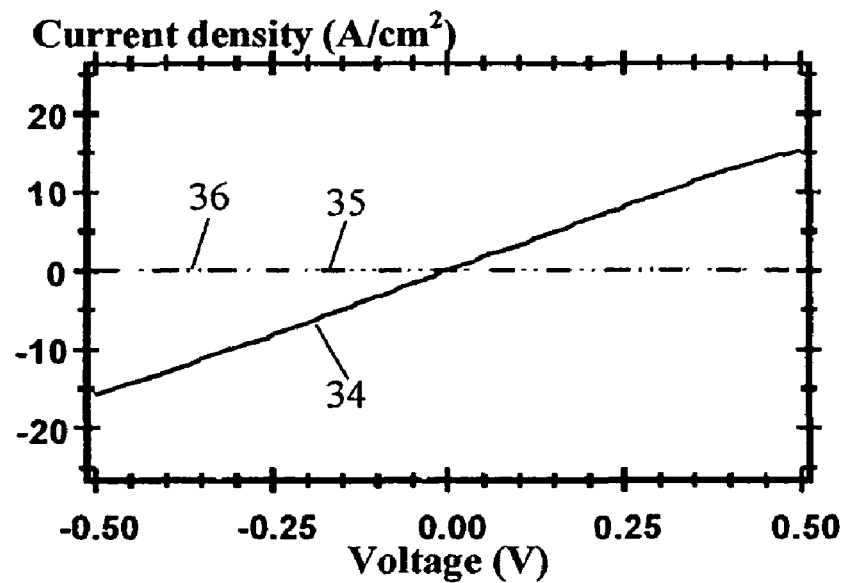
FIG. 14 shows results of I-V measurements between two 500 μm diameter contacts.
Figure 15:
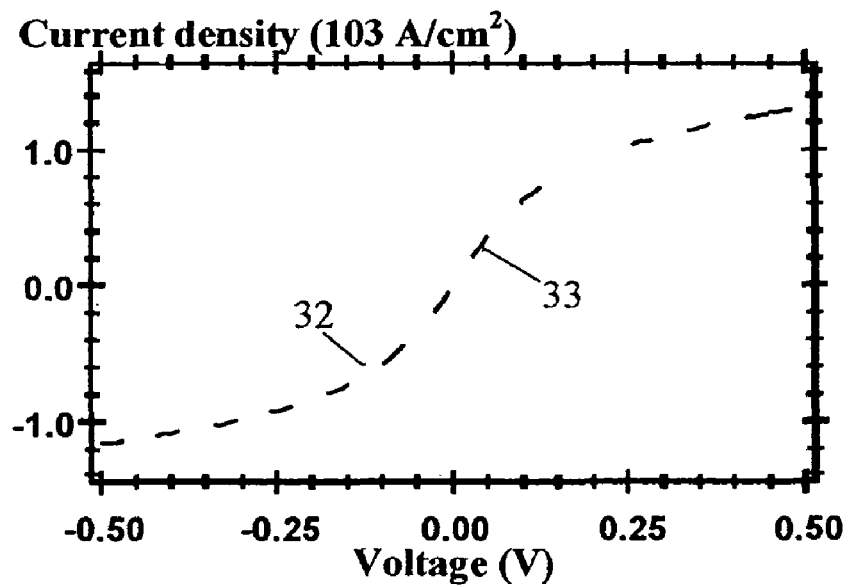
FIG. 15 shows a zoom of the I-V measurements between two 500 μm diameter contacts as shown in FIG. 14.

For experiment 6, an n-type Ge(111) substrate 1 was nitridated at high temperature of between 700° C. and 800° C. to form a thin monocrystalline GeN layer 4 on the substrate 1. The existence of this GeN layer 4 was confirmed by RHEED measurements and by spectroscopic ellipsometry. The sample was dipped into a 2% HF solution for 1 minute. Spectroscopic ellipsometry showed the removal of the GeN layer 4 after this dip. The sample was then loaded into a UHV system. The sample was annealed for 10 minutes at ~350° C., to degas the sample. RHEED measurements indicated the removal of the GeN layer 4 and showed a nice reconstructed Ge surface. Immediately after unloading from the UHV system, a 100 nm thick Al layer was deposited with a shadow mask. The 100 nm Al layer was covered with 100 nm Au to protect the Al from oxidation. Current-Voltage measurements clearly indicated a rectifying behavior (low current density) between the Al contacts 6 and a backside contact 20 of the Ge substrate 1 and also a high resistance between two 500 μm diameter Al contacts 6, 7. FIG. 13 shows results of I-V measurements between a 500 μm contact 6 and a backside contact 20. Curve 31 shows I-V measurements for Al/GeN/Ge contact, curve 32 for Al/Ge contacts and curve 33 for Al/Ge contacts for which GeN was removed by HF. FIG. 14 shows results of I-V measurements between two 500 μm diameter contacts 6, 7. Curve 34 shows I-V measurements for Al/GeN/Ge contacts, curve 35 for Al/Ge for which GeN was removed by HF and curve 36 for Al/Ge contacts. FIG. 15 shows a zoom of the I-V measurements between two 500 mm diameter contacts 6, 7 as shown in FIG. 14 for the Al/Ge contacts (curve 32) and for Al/Ge for which GeN was removed by HF (curve 33). This shows the thin GeN layer 4 is responsible for lowering the contact resistance and not a doping effect of nitrogen into the Ge. This also shows that the high temperature nitridation does not affect the Ge substrate 1, whereas for other contacting methods where an annealing is required (for example AuGe/Ni/Au) metals diffuse into the Ge and will influence the Ge substrate underneath the metal contact. The GeN layer can therefore easily be removed at certain places, i.e. it can be patterned, without leaving a changed or damaged underlying Ge layer.

EXPERIMENT 7

In this experiment, it is illustrated that layers of good quality can be deposited or grown on top of the monocrystalline GeN layer 4 formed with the method according to embodiments of the invention. Therefore, a GaN layer 5 was grown onto a GeN/Ge(111) substrate and the crystal quality of this GaN layer 5 was studied. First, a Ge(111) substrate 1 was cleaned to remove, for example, oxides and/or organic materials which may be present at the surface of the substrate 1. Cleaning was done by chemical cleaning. After cleaning, the Ge(111) substrate 1 was loaded in the MBE system and outgassed while it was heated to about 550° C. Prior to growth of the GaN layer 5, the Ge surface 3 of the substrate 1 was exposed to a nitrogen gas flow at a nitridation temperature between 550° C. and 750° C., in that way forming a thin GeN layer 4 which then enables crystalline growth of the GaN layer 5. After the creation of the GeN layer 4, GaN was deposited by providing a Ga source flow next to the nitrogen gas flow at different deposition temperatures between 550° C. and 800° C. for different experiments, in order to determine optimal growth conditions.

According to the present example, plasma-assisted MBE is used and thus the nitrogen source for the nitrogen gas flow may, according to the present example, be formed by a nitrogen plasma. The nitrogen gas flow and the Ga flux may preferably have a comparable atomic flux. During deposition, the pressure in the deposition chamber was in the order of $10^{-5}$ Torr. The deposition rate was in the order of 180 to 690 nm/h. Different GaN layers 5 with thicknesses between 1.5 nm en 450 nm were deposited.

During growth, the surface morphology and crystal quality of the different GaN layers 5 have been studied RHEED. The grown GaN layers 5 were then afterwards studied with XRD omega-2theta scan and omega scan.

In a first experiment, a thin GaN layer 5 of ~10 nm was deposited or grown at a deposition temperature of 550° C. On top of this thin GaN layer 5 a thicker GaN layer of ~310 nm was deposited at a higher temperature of 750° C.

In a second set of experiments, a thin GaN layer of ~35 nm was deposited at a temperature of 750° C. On top of this layer a thicker GaN layer of ~290 nm was deposited at different temperatures below the deposition temperature of the thin GaN layer, i.e. at ~550° C., ~620° C. and ~690° C. Growth at a temperature of ~800° C. (i.e. above the temperature of the thin GaN layer) was also performed but the crystal quality of the resulting layer was not better than for the sample grown at 750° C.

From these experiments it can be concluded that a GaN layer 5 with the best crystal quality was obtained when both the thin and the thicker layer were deposited at higher temperatures, i.e. at 750° C. It was observed that the higher the deposition temperature is, the better the crystal quality of the resulting layer is. However, at deposition temperatures above 750° C. the crystal quality of the deposited layers does not substantially improve anymore. Furthermore, when the GaN layer is deposited at too high temperatures, RHEED indicates that the surface can roughen.

When GaN growth starts, the RHEED diffraction pattern showed a smooth transition from Ge streaks towards GaN streaks in a few tens of seconds. During the transition no roughening of the surface is observed. The RHEED streaks stay smooth and do not show spots, indicating a smooth surface. This indicates that the GaN lattice fits well on top of the Ge crystal. This is because of the presence of the thin GeN layer 4, which may preferably only be 1 to 2 monolayers thick. The distance between the main streaks visible in the RHEED diffraction pattern does not change when the Ge is nitridated. This indicates that the GeN layer 4 that is formed has the same in-plane lattice parameters as the Ge of the substrate 1 underneath. This result is in contradiction with expectations based on the theoretical lattice mismatch between GaN and Ge being −20.3%. From this large lattice mismatch, roughening would be expected to be seen during RHEED experiments at the start of GaN growth.

The distance of the RHEED streaks changes abruptly at the start of GaN growth. From an analysis of the distance between the streaks of GaN and the Ge lattice, an in-plane lattice parameter of 3.20 (±0.02) Å could be extracted in case of a thin GaN layer 5 of about 40 nm grown on top of the substrate 1. This indicates that the GaN is not stressed and that the GaN grows relaxated from the beginning. This is a good sign because defects occur when a layer is stressed in order to relieve that stress.

In Table 6 results with respect to the crystal quality are shown for a thin layer of 38 nm of GaN on Ge(111).

TABLE 6

Experimental results for a 38 nm thick GaN layer on a Ge(111) substrate.

| Growth | Integrated peak intensity GaN (%) | FWHM Ω GaN (s) | FWHM Ω/2θ GaN (s) | FWHM Ω/2θ Ge (s) | Thickness GaN nm |
|---|---|---|---|---|---|
| sample | 2.1 | 371 | 396 | 58 | 38 |

Figure 16:
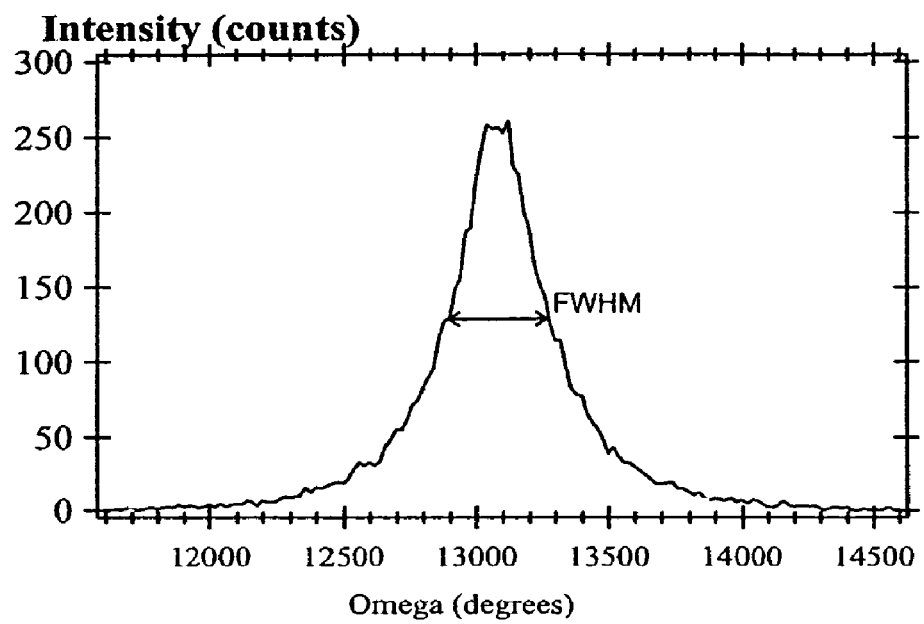
FIG. 16 shows results, of an XRD omega scan for a GaN layer of 38 nm deposited on a Ge (111) substrate.

For the example of a 38 nm thick GaN layer 5 on a Ge(111) substrate 1, an XRD FWHM value of the omega scan was determined to be only 371 arcseconds (see FIG. 16), which is very good considering the small thickness of this layer 5. The lower the XRD FHM value is, the better the crystal quality of the GaN layer 5 will be and the more suitable the GaN/Ge structure formed will be for use in e.g. semiconductor devices. This is because of the better electrical properties due to higher electron mobility.

Figure 17:
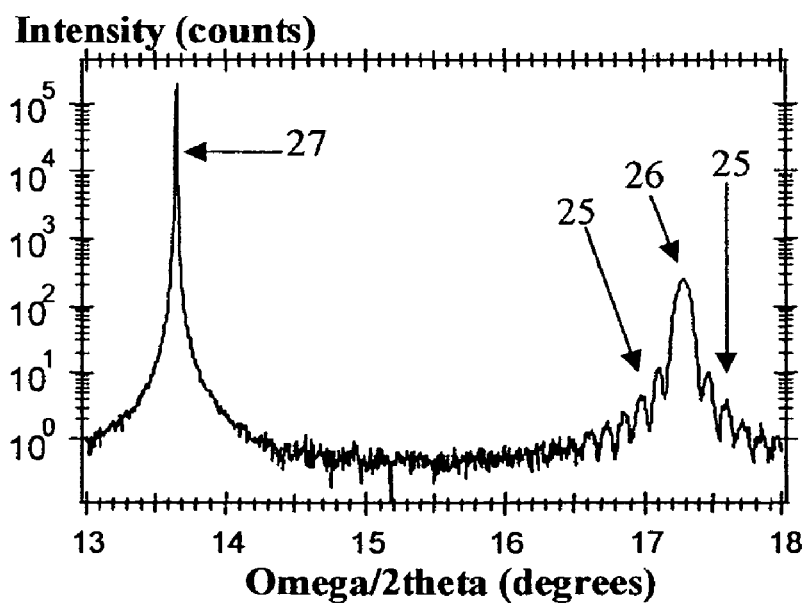
FIG. 17 shows results of an XRD omega-2theta scan for a GaN layer of 38 nm deposited on a Ge (111) surface.

Thin layer fringes, indicated by reference number 25, are visible in the omega-2theta scan (see FIG. 17). The presence of such fringes 25, also referred to as Kiessig fringes, are indicative for a good interface quality between the GaN layer 5 (indicated by peak 26) and the Ge substrate 1 (indicated by peak 27). The GeN layer 4 is, as already discussed before, preferably not much thicker than a few monolayers and forms a natural transition between Ge and GaN, but is too thin to be observed in XRD experiments.

The GaN layer 5 formed according to the present example has a crystal quality which is comparable to or better than the crystal quality of GaN grown or deposited on a Si substrate with at least one intermediate layer in between the GaN and the substrate and which is comparable to the crystal quality obtained for GaN on Sapphire substrates with at least one intermediate layer (low quality GaN layer grown at low temperature) in between the good quality GaN and the substrate. For GaN on Sapphire average values for the XRD omega scan of 300 arcseconds are, obtained and for GaN on Si average values for the XRD omega scan of 600 arcseconds are obtained for thick GaN layers, i.e. for GaN layers 5 with a thickness of higher than 1 micron (see earlier). For thin layers no other substrate can compare to Ge to grow GaN on. Thin layers, such as the 40 nm thick GaN layer 5 of the present example, cannot be grown on Si, Sapphire or SiC with such good quality as is obtained with the method according to embodiments of the present invention for GaN on Ge. For thicker layers, Sapphire gives better quality.

From XRD omega-2theta scan analysis (FIG. 17), an out-of-plane lattice parameter of 5.1897 (±0.0008) Å was found by looking at the position (angle) of the GaN peak 26. This means that, comparing this experimental value with the standard lattice parameter of 5.18524 Å, the GaN layer 5 obtained according to this example is under small compressive stress after growth. This is in agreement with curvature measurements performed on the GaN/Ge structures where a radius of −87 m was measured. This result is in contradiction with expectations based on the theoretical lattice mismatch between GaN and Ge of −20.3%. From this lattice mismatch value a very large tensile stress would be expected.

Figure 18A:
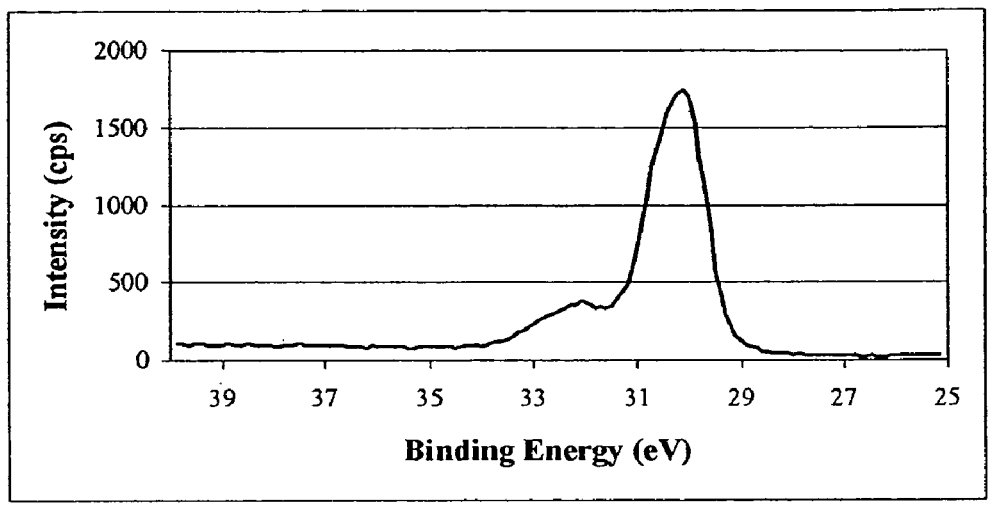
FIGS. 18A and 18B show XPS results of a nitridated Ge(111) substrate.
Figure 18B:
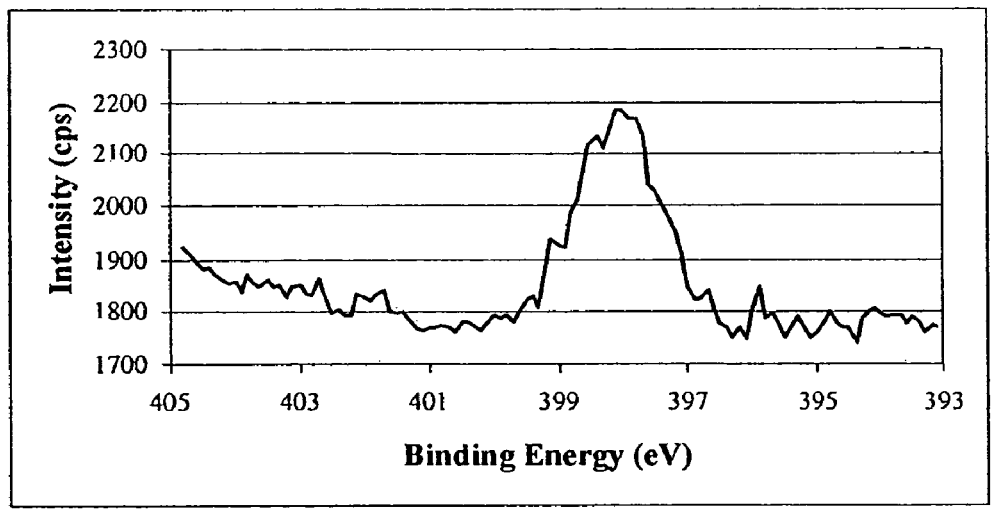

X-ray Photoelectron Spectroscopy (XPS) measurements performed on a nitridated Ge substrate formed according to the first example show a peak for Ge (see FIG. 18A) and GeN (see FIG. 18B). The second, small peak in FIG. 18A just before the Ge peak may be due to a Ge-nitride binding. FIG. 18B proves that this second, small peak is due to a nitride binding because the binding energy coincides with reference nitride binding energy (for WN, BN and NaSCN), which lies between 397 and 398 eV as can be seen from FIG. 18B. FIG. 18A shows a large peak that is due to the Ge substrate (Ge—Ge binding). The small peak in FIG. 18A is due to the binding of Ge and another element. FIG. 18B shows the peak due to the binding of nitrogen with another element. This shows that the small peak in FIG. 18A is due to the binding of Ge and N. The peak of the binding of an element, for example Ge, shifts very slightly when it binds with another element. So the peak of Ge bound with N is a little shifted with respect to the peak of Ge bound with Ge.

The size of the peak is indicative for the thickness of the GeN layer. So from the small peak the thickness of the GeN can be estimated. When the smallest peak of the spectrum in FIG. 14A is fitted to $Ge_3N_4$ a thickness of 0.7 nm is found. The measurements illustrated in FIGS. 7A and 7B indicate the formation of a GeN layer 4 in between the Ge substrate 1 and the GaN layer 5.

In Table 7, atomic concentrations found in XPS measurements are represented for a surface of a Ge substrate 1 before and after exposure to a nitrogen gas flow. After exposure both Ge and N are present indicating the presence of a GeN layer 4.

TABLE 7

Atomic concentration measured at 21.88 deg on Ge substrates before (ref Ge) and after exposure to a nitrogen gas flow (GeN/Ge)

| | C1s | Ge3d | Ge3d O | O1s | N1s |
|---|---|---|---|---|---|
| Ref Ge | 7.99 | 74.79 | 3.48 | 13.73 | |
| GeN/Ge | 5.95 | 56.5 | 15.66 | 8.02 | 13.87 |

The formation of a GeN layer 4 prior to GaN deposition or growth allows the GaN to fit much better than expected on top of a Ge surface with hexagonal symmetry, as was confirmed by the stress results earlier described. The thermal mismatch between GaN en Ge is small (+5.5%) leading to small compressive stress when the sample is cooled down after growth.

SIMS results for a 450 nm thick GaN layer 5 on a Ge substrate 1 showed limited diffusion of Ga atoms into the Ge substrate 1 and Ge atoms into the GaN layer 5.

From this experiment it can be concluded that the best layer quality for GaN layers 5 deposited onto a GeN/Ge substrate may be obtained for thin layers of ~50 nm or less. For thicker layers the quality may be slightly reduced, but is still good. This may be due to the fact that when the GaN layer 5 becomes thicker the surface temperature may change because the GaN differently absorbs heat than the Ge substrate 1 and also the heat conduction may be different. Hence, during growth the surface temperature may change and therefore, optimal required growth parameters may change as well.

EXPERIMENT 8

According to this experiment, an InN layer has been grown on the structure similar to the one obtained in experiment 9, or in other words, an InN layer has been grown on top of a GaN/GeN/Ge structure. According to this example, the GaN layer 5 has a thickness of 5 nm and the InN layer on top of the GaN layer 5 has a thickness of 50 nm. An omega/2theta FWHM of 839 arcseconds and a omega scan FWHM of 903 arcseconds were measured. The rocking curve value is much smaller than reported before for InN on Ge substrates, which means that the InN layer deposited on the GaN layer has a good crystal quality. In the omega/2theta scan no GeN peak was observed. This is because the GeN layer is preferably only 1 or 2 monolayers thick and can be considered as a binding or transition between two materials, i.e. Ge and GaN, and should, when it is only 1 or 2 monolayers thick.

EXPERIMENT 9

In a further experiment, the growth of AlN on a GeN/Ge (111) substrate was studied. Therefore, a ~97 nm thick AlN layer was grown on a Ge(111) 1 substrate after nitridation of the substrate 1. Form the Omega/2theta XRD scan an FWHM ~248 arcseconds was found. The FWHM of the omega scan was ~1828 arcseconds. The crystal quality is less when compared to GaN growth on Ge, nevertheless it is proven that crystalline AlN can be grown on a GeN/Ge substrate when a GeN layer 4 was formed using the method according to embodiments of the present invention.

EXPERIMENT 10

It was furthermore illustrated that it is also possible to grow InN on a Ge substrate 1 using the method according to embodiments of the present invention, i.e. by first forming a GeN layer 4 on the Ge substrate 1. In this experiment, growth of an InN layer was performed on a GeN/Ge substrate as well as on a bare Ge substrate. In both cases, i.e. in the case where nitridation was performed and in the case where no nitridation was performed, the growth of InN was performed at temperatures between 250° C. and 350° C. Nitridation prior to growth of InN reads to crystalline InN whereas the process without a nitridation step and thus without formation of a GeN layer 4 in between the substrate 1 and the InN layer, leads to amorphous (non-crystalline) InN. This is confirmed by the absence of an InN peak in the omega/2theta scan.

EXPERIMENT 11

In a further experiment, an AlGaN layer comprising ~8% Al and ~92% Ga was formed on a GeN/Ge substrate at a temperature of ~750° C. The quality of the AlGaN in this case is found to be slightly less than that of GaN layers of comparable thickness, but is still very good. In the omega/2theta scan the AlGaN peak moved a little bit to the right when compared to pure GaN because of the extra Al present in the alloy. From this experiment it can be concluded that high quality AlGaN can be grown on a GeN/Ge substrate formed with the method according to embodiments of the present invention.

EXPERIMENT 12

In a last experiment, onto a Ge(111) substrate 1 with ~4.7° misorientation towards (110), a ~300 nm thick GaN layer 5 was grown after formation of a GeN layer 4 on the substrate 1 with the method according to embodiments of the invention. The substrate temperature and nitrogen gas flow were optimized to achieve good crystal quality. A phi scan around the [002] axis (see FIG. 17) was performed. In the omega-2theta scan only one GaN peak was observed, instead of two for on axis Ge(111) substrates. Different peaks indicate the presence of different GaN phases, rotated in the plane of the layer. The fact that there is only one peak indicates that there is only one GaN phase. This shows that off cut Ge(111) substrates 1 can be used to obtain one GaN phase instead of two for the on axis substrates.

It is to be understood that although preferred embodiments, specific constructions and configurations, as well as materials, have been discussed herein for devices according to the present invention, various changes or modifications in form and detail may be made without departing from the scope of this invention as defined by the appended claims.

The invention claimed is:

1. A method for forming a monocrystalline GeN layer on a substrate, the method comprising:
   exposing a substrate, heated to a temperature of from 550° C. to 940° C., to a nitrogen gas flow, wherein the substrate has a Ge surface, whereby a monocrystalline GeN layer is formed on the substrate.

2. The method of claim 1, wherein the Ge surface has a hexagonal structure.

3. The method of claim 1, wherein the Ge surface has a (111) orientation with an off-cut of from 0° to 15°.

4. The method of claim 1, wherein the nitrogen gas comprises a gas selected from the group consisting of $N_2$ and $NH_3$.

5. The method of claim 1, further comprising applying a plasma while exposing the substrate to the nitrogen gas flow.

6. The method of claim 1, wherein the Ge surface is reorganized upon heating the substrate.

7. The method of claim 1, further comprising patterning the GeN layer.

8. The method of claim 1, further comprising cooling down of the substrate to a temperature below 650° C. after formation of the monocrystalline GeN layer, wherein the nitrogen gas flow is maintained during cooling.

9. The method of claim 1, further comprising forming metal contacts on the monocrystalline GeN layer.

10. The method of claim 9, wherein the metal contacts are Ohmic contacts.

11. The method of claim 9, wherein the metal contacts are Schottky contacts.

12. The method of claim 1, further comprising forming at least one group III-nitride layer on the GeN layer.

13. The method of claim 12, wherein forming at least one group III-nitride layer on the GeN layer is performed by depositing at least one group III-nitride layer at a deposition temperature of from 550° C. to 850° C.

14. The method of claim 12, further comprising patterning at least one of the group III-nitride layers.

15. The method of claim 1, wherein the method is part of a manufacturing process for making a junction diode.

16. A structure comprising
    a substrate having a crystalline Ge surface; and
    a monocrystalline GeN layer on top of and in direct contact with the Ge surface of the substrate, wherein the monocrystalline GeN layer is pseudomorphic on the crystalline Ge surface.

17. The structure of claim 16, wherein the crystalline Ge surface has a hexagonal symmetry.

18. The structure of claim 16, wherein the crystalline Ge surface has (111) orientation.

19. The structure of claim 16, wherein the crystalline Ge surface has (111) orientation with an off-cut between 0° and 15°.

20. The structure of claim 16, wherein the monocrystalline GeN layer has a thickness of from 0.3 nm to 10 nm.

21. The structure of claim 16, wherein the monocrystalline GeN layer is a patterned monocrystalline GeN layer.

22. The structure of claim 16, further comprising metal contacts in direct contact with the monocrystalline GeN layer.

23. The structure of claim 22, comprising at least a part of a junction diode.

24. A junction diode consisting of the structure of claim 16.

25. The structure of claim 22, wherein the metal contacts are Ohmic contacts.

26. The structure of claim 22, wherein the metal contacts are Schottky contacts.

27. The structure of claim 22, further comprising at least one insulating layer on top of the GeN layer.

28. The structure of claim 27, wherein the at least one insulating layer comprises a material selected from the group consisting of SiN, SiO, HfO, and organic materials.

29. A structure comprising:
    a substrate having a Ge surface;
    a monocrystalline GeN layer on top of and in direct contact with the Ge surface of the substrate;
    metal contacts in direct contact with the monocrystalline GeN layer; and
    at least one group III-nitride layer on the monocrystalline GeN layer.

30. The structure of claim 29, wherein at least one of the group III-nitride layers is a patterned layer.

* * * * *